US012563732B2

(12) United States Patent

Ahn

(10) Patent No.:   US 12,563,732 B2

(45) Date of Patent:      Feb. 24, 2026

(54) THREE-DIMENSIONAL SEMICONDUCTOR DEVICE AND METHOD OF MANUFACTURING THE SAME

(71) Applicant: SK hynix Inc., Icheon-si (KR)

(72) Inventor: Jung Ryul Ahn, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 564 days.

(21) Appl. No.: 18/085,365

(22) Filed: Dec. 20, 2022

(65) Prior Publication Data

US 2023/0301102 A1      Sep. 21, 2023

(30) Foreign Application Priority Data

Mar. 18, 2022    (KR) ........................ 10-2022-0034069

(51) Int. Cl.
H10B 43/27 (2023.01)
H01L 23/535 (2006.01)

(52) U.S. Cl.
CPC ........... H10B 43/27 (2023.02); H01L 23/535 (2013.01)

(58) Field of Classification Search
CPC ........ H10B 43/27; H10B 43/10; H10B 43/50; H10B 43/30; H10B 43/40; H10B 41/27; H01L 23/535; H01L 27/11582; H01L 27/112
See application file for complete search history.

(56) References Cited

U.S. PATENT DOCUMENTS

| 9,716,101 | B2 | 7/2017 | Lu et al. | |
|---|---|---|---|---|
| 2014/0302655 | A1* | 10/2014 | Ahn | H10D 30/69 |
| | | | | 438/287 |
| 2018/0204880 | A1* | 7/2018 | Fantini | H10B 63/24 |
| 2021/0066345 | A1* | 3/2021 | Son | H10B 43/35 |
| 2022/0085062 | A1* | 3/2022 | Unno | H10B 41/10 |
| 2023/0301103 | A1 | 9/2023 | Lee et al. | |

FOREIGN PATENT DOCUMENTS

KR      20230123186 A  *  8/2023  ............. H10B 43/27

* cited by examiner

*Primary Examiner* — Christine S. Kim
*Assistant Examiner* — Andrew Victor Prostor
(74) *Attorney, Agent, or Firm* — WILLIAM PARK AND ASSOCIATES LTD.

(57)      ABSTRACT

A three-dimensional (3D) semiconductor device may include a stack structure and a vertical channel structure. The stack structure may include a first insulation pattern, a conductive pattern and a second insulation pattern. The conductive pattern may be arranged on the first insulation pattern. The second insulation pattern may be configured to physically contact an upper surface of the conductive pattern. The second insulation pattern may have a property different from a property of the first insulation pattern. The vertical channel structure may be formed through the stack structure.

20 Claims, 26 Drawing Sheets

<u>3000</u>

THREE-DIMENSIONAL SEMICONDUCTOR DEVICE AND METHOD OF MANUFACTURING THE SAME

CROSS-REFERENCES TO RELATED APPLICATION

The present application claims priority under 35 U.S.C. § 119(a) to Korean application number 10-2022-0034069, filed on Mar. 18, 2022, in the Korean intellectual Property Office, which is incorporated herein by reference in its entirety.

BACKGROUND

1. Technical Field

Various embodiments generally relate to a semiconductor device and a method of manufacturing the same, and more particularly, to a three-dimensional semiconductor device and a method of manufacturing the three-dimensional semiconductor device.

2. Related Art

An integration degree of a semiconductor device may be mainly determined by an occupying area of a unit memory cell. Recently, as integration degree improvements of the semiconductor device including a single memory cell on a substrate may have been come to limits, a three-dimensional (3D) semiconductor device including memory cells stacked on a substrate may be proposed. Further, to improve operational reliability of the 3D semiconductor device, various structures and fabrication methods may be developed.

SUMMARY

According to an embodiment, a three-dimensional (3D) semiconductor device may include a stack structure and a vertical channel structure. The stack structure may include a first insulation pattern, a conductive pattern and a second insulation pattern. The conductive pattern may be arranged over the first insulation pattern. The second insulation pattern may be configured to physically contact an upper surface of the conductive pattern. The second insulation pattern may have a property different from a property of the first insulation pattern. The vertical channel structure may be formed through the stack structure.

According to an embodiment, a three-dimensional (3D) semiconductor device may include a stack structure and at least one vertical channel structure. The stack structure may be divided into a cell region and a contact region. The stack structure may include a unit stack stacked once. The unit structure may include a first insulating interlayer, a word line and a second insulating layer. The vertical channel structure may include a data storage layer formed through the stack structure in the cell region. The first insulating interlayer and the second insulating interlayer may have different properties. The first and second insulating interlayers may have a first thickness.

In example embodiments, at least one of the first and second insulating interlayers may include oxide such as silicon oxide and metal containing oxide, nitride such as silicon nitride and silicon oxynitride and an air gap.

In example embodiments, the first and second insulating interlayers may include a same kind of material having different stoichiometries.

In example embodiments, the first and second insulating interlayer may include different kinds of materials. A dielectric constant range of the first insulating interlayer may be overlapped with dielectric constant range of the second insulating interlayer.

In example embodiments, the word line may include a molybdenum layer. The molybdenum layer may have a first surface configured to contact the first insulating interlayer and a second surface configured to contact the second insulating interlayer.

In example embodiments, the word line may include a barrier layer and a conductive layer stacked on the barrier layer. The barrier layer may be configured to contact the first insulating interlayer. The conductive layer may be configured to contact the second insulating interlayer.

According to the present disclosure is a method of manufacturing a 3D semiconductor device. In the method, a first insulating interlayer and a sacrificial layer may be alternately stacked at least once to form a stack structure. The sacrificial layer may be selectively removed to form an opening between the first insulating interlayers. A conductive layer may be formed on an inner surface of the opening. A second insulating interlayer may be formed in the opening with the conductive layer. The conductive layer on a lower surface of the second insulating interlayer and the conductive layer on an upper surface of the second insulating interlayer may be separated from each other to form a word line. A vertical channel structure may be formed through the stack structure.

According to an example, a preliminary conductive pattern configured to surround an insulating pattern may be partially etched to form the two conductive patterns. Thus, an integration degree of the 3D semiconductor device may be improved by a simple process.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of presented embodiments. However, the presented embodiments should not be construed as limiting the present teachings. Although a few embodiments of the present teachings will be shown and described, it will be appreciated by those of ordinary skill in the art that changes may be made in these embodiments without departing from the principles and spirit of the present teachings.

Hereinafter, a 3D semiconductor device of example embodiments may be illustrated in detail with reference to the accompanying drawings.

Figure 1A:
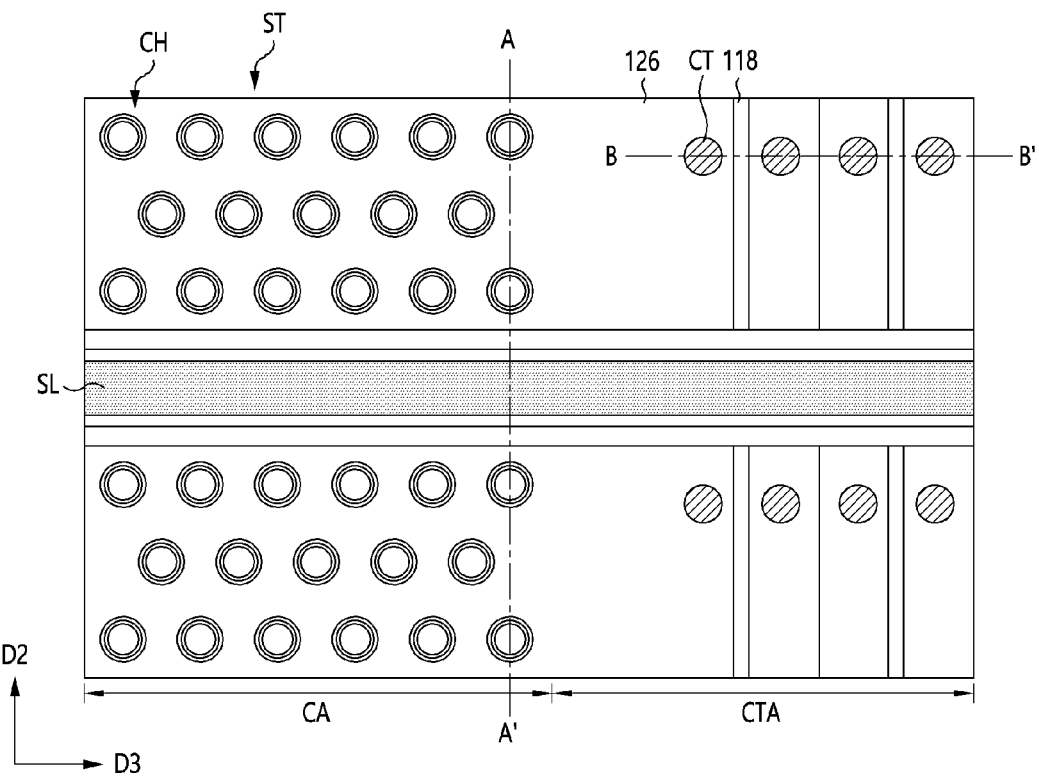
FIGS. 1A to 1C are views illustrating a 3D semiconductor device in accordance with various embodiments.
Figure 1B:
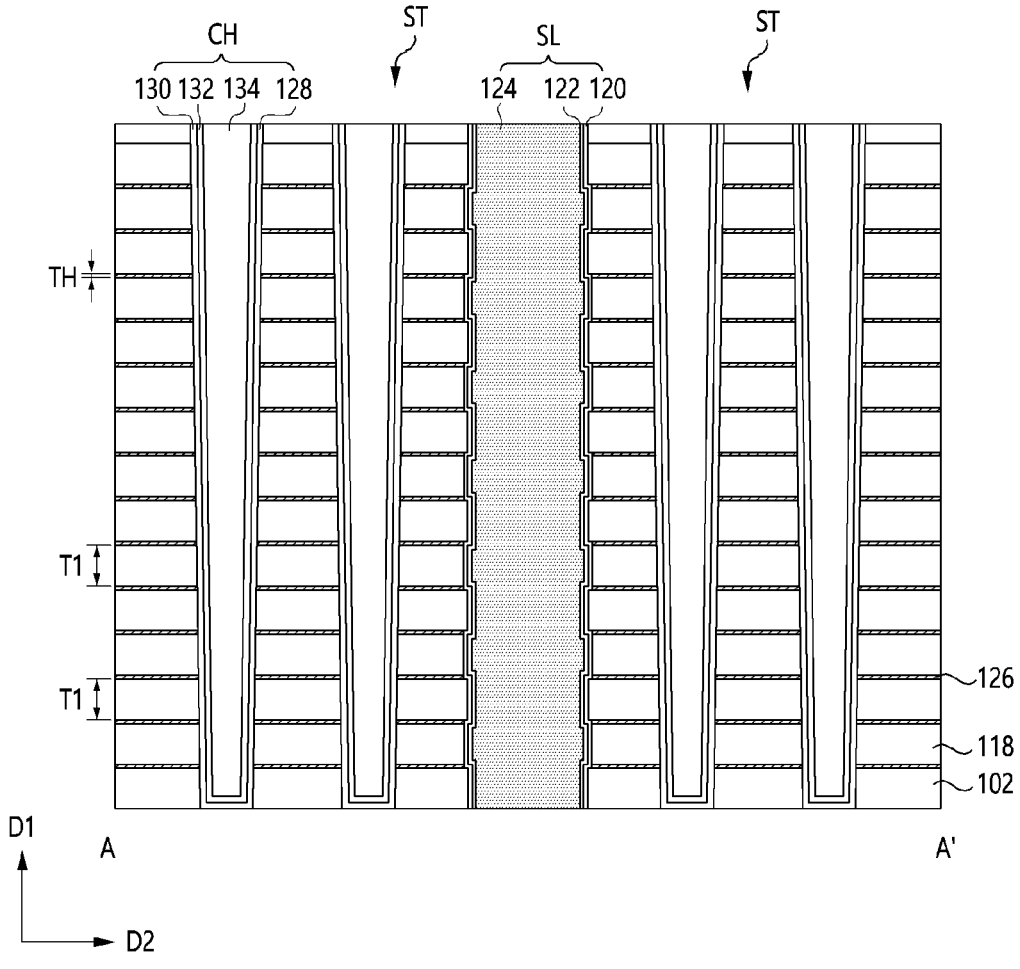
Figure 1C:
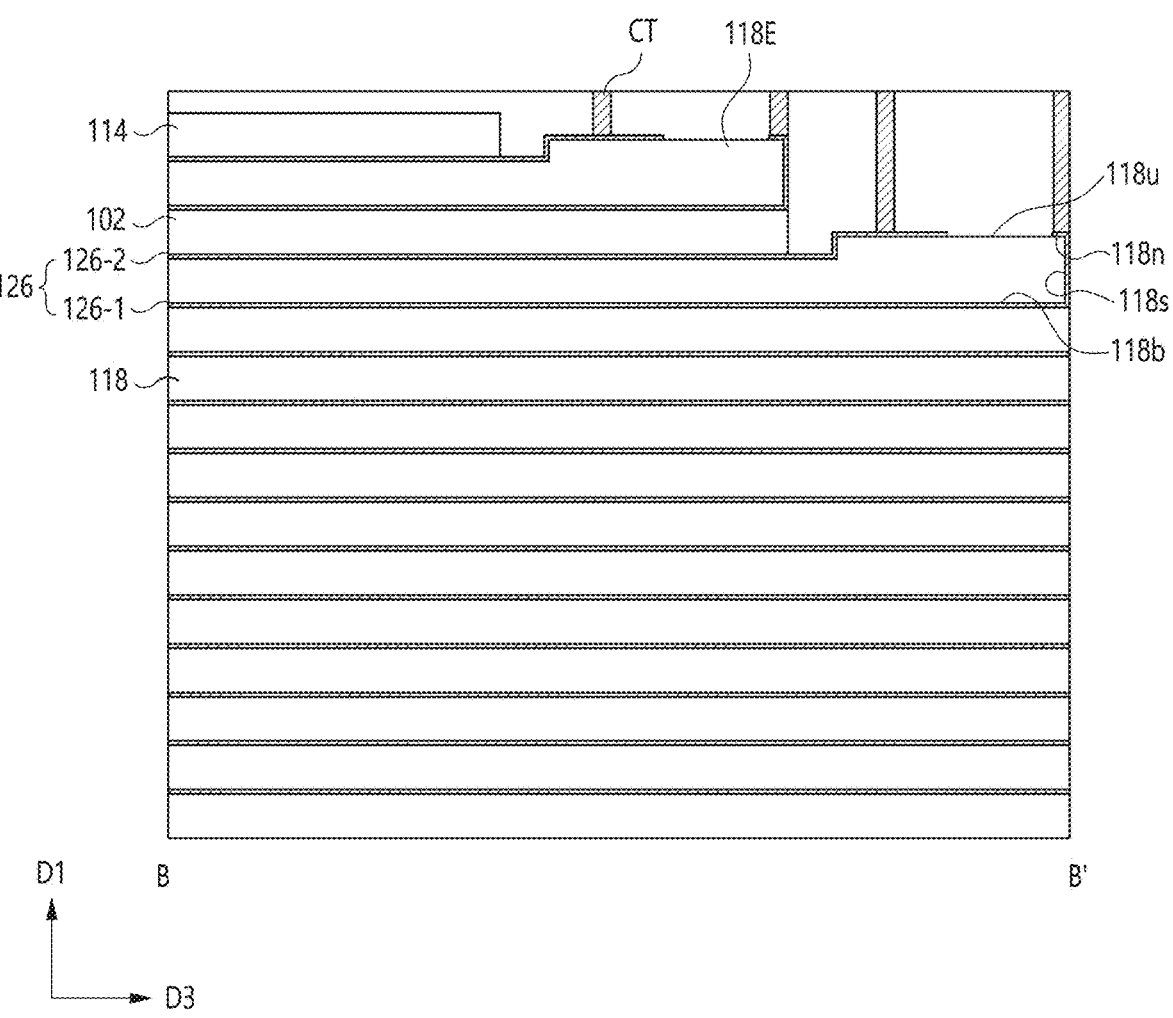

FIGS. 1A to 1C are views illustrating a 3D semiconductor device in accordance with example of embodiments, FIG. 1A is a plan view illustrating the 3D semiconductor device. FIG. 1B is a cross-sectional view taken along a line A-A' in FIG. 1A. FIG. 1C is a cross-sectional view taken along a line B-B' in FIG. 1A.

Referring to FIGS. 1A to 1C, a 3D semiconductor device may include a stack structure ST, a vertical channel structure CH, and contact plugs CT.

The stack structure ST may include a plurality of first insulation patterns 102, a plurality of conductive patterns 126, and a plurality of second insulation patterns 118 which are sequentially and vertically stacked. Each of the conductive patterns 126 may be arranged between the first insulation pattern 102 and the second insulation pattern 118.

The adjacent conductive patterns 126 may be electrically isolated by the first insulation pattern 102 or the second insulation pattern 118. The first and second insulation patterns 102 and 118 may include different materials. In example embodiments, the stack structure ST may include the first insulation patterns 102, the conductive pattern 126, the second insulation patterns 118, the conductive pattern 126, and the first insulation pattern 102 repeatedly stacked in a first direction D1.

In example embodiments, the first insulation pattern 102 and the second insulation pattern 118 may include different insulation materials. For example, at least one of the first and second insulation patterns may include an oxide material including silicon oxide and metal oxide, a nitride material including silicon nitride and silicon oxynitride, and an insulation material including impurities and an air gap. Any one of the first and second insulation patterns 102 and 118 may include silicon oxide. The other one of the first and second insulation patterns 102 and 118 may include silicon nitride or silicon oxynitride. Alternatively, the first insulation pattern 102 and the second insulation pattern 118 may include a same material having different chemical compositions, i.e., different stoichiometries. For example, any one of the first and second insulation patterns 102 and 118 may include silicon-rich nitride. The other one of the first and second insulation patterns 102 and 118 may include a stoichiometry-matched silicon nitride or silicon-poor silicon nitride or nitrogen-poor silicon nitride. Further, the first insulation pattern 102 may include insulation material with first impurities and the second insulation pattern 118 may include insulation material with second impurities different from the first impurities. The first and second impurities may include n-type impurities, p-type impurities, carbon, or nitrogen. A dielectric constant range of the first insulation pattern 102 may be overlapped with a dielectric constant range of the second insulation pattern 118.

As described above, the dielectric constant range of the first insulation pattern 102 may be overlapped with the dielectric constant range of the second insulation pattern 118. For example, at least one of the first insulation pattern 102 and the second insulation pattern 118 may include any one of a perovskite ternary metal oxide layer such as $SrZO_3$, $LaAlO_3$, $CaZrO_3$, or $SrTiO_3$, a binary metal layer such as $ZrO_3$, $HfO_2$, $La_2O_3$ or $Ta_2O_5$, and an amorphous metal oxide layer.

In example embodiments, the second insulation pattern 118 may include an insulation material having good gap-filling characteristic than that of the first insulation pattern 102.

In example embodiments, the first and second insulation patterns 102 and 118 may be formed by different deposition processes. For example, the first insulation pattern 102 may be formed by a chemical vapor deposition (CVD) process or an atomic layer deposition (ALD) process. The second insulation pattern 118 may be formed by an ALD process having good gap-filling characteristic in a narrow space or a plasma enhanced ALD (PEAL) process.

The stack structure ST may include a cell region CA and a contact region CTA. The first insulation patterns 102 and the second insulation patterns 118 may cross the cell region CA and the contact region CTA.

Each of the first insulation patterns 102, the conductive pattern 126 and the second insulation patterns 118 in the contact region CTA may have a stepped structure having a downwardly protruded shape. This structure may be formed by a slimming process. An edge portion 118E of each of the second insulation patterns 118 may have a thickness thicker than a thickness of other portions of the second insulation pattern 118 in the cell region CA and the contact region CTA.

For example, the conductive patterns 126-1 and 126-2 facing each other with the second insulation pattern 118 therebetween may be electrically separated by a cutting portion 127 located in the edge portion 118E which is positioned at an upper surface 118u of the second insulation pattern 118.

Each of the conductive patterns 126 may have the thickness TH thinner than thicknesses of the second insulation pattern 118, The thickness TH of the conductive pattern 126 may be thinner than the thicknesses of the first insulation pattern 102 and the second insulation pattern 118 to reduce a height of the 3D semiconductor device. Further, a plurality of the conductive patterns 126 may be arranged in the 3D semiconductor device having a same height to improve an integration degree of the 3D semiconductor device. The conductive patterns 126 may include a metal such as tungsten (W), molybdenum (Mo), etc., polysilicon including conductive impurities, etc.

In example embodiments, the conductive pattern 126 may include at least one conductive material layer. For example, the conductive pattern 126 may include a barrier layer and a conductive layer, as the conductive material layer. The barrier layer may include a titanium nitride layer (TiN) or a titanium/titanium nitride layer (Ti/TiN). The barrier layer may be interposed between the first insulation pattern 102 and the conductive layer 126. The conductive layer 126 may include a tungsten material.

The conductive pattern 126 may include a molybdenum material, as the conductive material layer. When the molybdenum material is used to the conductive pattern 126, the barrier layer might not be required. The conductive pattern 126 may correspond to a word line in a cell string of a NAND memory device.

The conductive patterns 126 may be arranged on the cell region CA and the contact region CTA. Each of the conductive patterns 126 in the cell region CA may be configured to surround the vertical channel structures CH. In other word, the stacked conductive patterns 126 in the cell region CA may be disposed outside the vertical channel structures CH, The conductive patterns 126 may extend in parallel with each other in a second direction D2. As above, each of the conductive patterns 126 may correspond to the word line of the NAND memory device.

In the contact region CIA, lengths of the stacked conductive patterns 126 extending in the second direction D2 may be sequentially decreasing toward a stack direction (that is, the first direction D1) to connect interconnecting lines (not shown) for providing driving voltages to the stacked conductive patterns 126. Thus, the edge portion 118E of each of the stacked conductive pattern 126 may be exposed by the stepped structure.

For example, the conductive pattern 126-1 which is positioned on the first insulation pattern 102 and positioned under the second insulation pattern 118 may be formed along a lower surface 118b of the second insulation pattern 118, a side surface 118s of the second insulation pattern 118 and an end portion 118n of an upper surface 118u of the second insulation pattern 118. Here, the side surface 118s of the second insulation pattern 118 may extend from an end portion of the lower surface 118b of the second insulation pattern 118. The end portion 118n of the upper surface 118u of the second insulation pattern 118 may extend from the side surface 118s of the second insulation pattern 118.

Meanwhile, the conductive pattern 126-2 may be formed on the upper surface 118u of the second insulation pattern 118. Although, the conductive layers 126-1 and 126-2 are arranged on the same upper surface of the second insulation pattern 118, a cutting portion 127 may be formed at the edge portion 118E to electrically isolate the conductive layers 126-1 and 126-2, That is, the conductive layers 126-1 and 126-2 facing each other with one second insulation pattern 118 therebetween may be deposited in a form of one layer without a disconnection, when the one conductive layer is deposition. Because the conductive layers 126-1 and 126-2 may correspond to different word lines, the conductive layers 126-1 and 126-2 should be separated. To separate the conductive layers 126-1 and 126-2, a selected portion of the one conductive layer for forming the conductive layers 126-1 and 126-2 which is positioned at the edge portion 118E may be etched, to form a cut portion 127.

In examples of embodiments, end portions of the conductive layers 126-1 and 126-2 which are arranged in the edge portion 118E may be contacted with the contact plugs CT to be connected interconnecting lines for providing driving voltages. The contact plug CT contacted to the end portion of the conductive layer 126-1 and the contact plug CT contacted to the end portion of the conductive layer 126-2 may have a same height.

The vertical channel structures CH may be formed through the stack structure ST along the first direction D1. The vertical channel structures CH may be provided to only the cell region CA, Each of the vertical channel structures CH may have a cylindrical shape. The cylindrical vertical channel structure CH may have downwardly decreasing diameters.

In a planar view defined along the second direction D2 and the third direction D3 substantially perpendicular to the first direction D1, the vertical channel structures CH may include first vertical channel structures CH and second vertical channel structures CH. The first vertical channel structures CH may be spaced apart from each other in a first row. The second vertical channel structures CH may be arranged in a second row between the adjacent first vertical channel structures CH. The first vertical channel structures CH and the second vertical channel structures CH may be repeatedly arranged in a plurality of rows, not limited thereto.

Each of the vertical channel structures CH may include a channel 134 and memory layers 128, 130, and 132 configured to surround the channel 134. The channel 134 may include a semiconductor material such as silicon, germanium, a nano-structure, etc. The memory layers 128, 130, and 132 may be interposed between the channel 134 and the conductive pattern 126, For example, the memory layers 128, 130, and 132 may include a tunnel insulation layer 132, a data storage layer, and a blocking insulation layer 128, The tunnel insulation layer 132 may be configured to surround the channel 134. The data storage layer 130 may be configured to surround the tunnel insulation layer 132. The blocking insulation layer 128 may be configured to surround the data storage layer 130, The data storage layer 130 may store data changed using a Fowler-Nordheim tunneling. In example embodiments, the data storage layer 130 may include charge-trapping nitride. The blocking insulation layer 128 may include oxide for blocking a charge. The tunnel insulation layer 132 may include silicon oxide capable of a charge tunneling.

When the stack structure ST may be in plurals, the adjacent two stack structures ST may be spaced apart from each other by a slit structure SL. In example embodiments, the slit structure SL may include a source contact plug 124 and insulation spacers 120 and 122. The insulation spacers 120 and 122 may be configured to surround a sidewall of the source contact plug 124. Alternatively, the slit structure SL may include only an insulation material. Further, the slit structure SL may include only the insulation spacers 120 and 122 without the source contact plug 124.

The contact plugs CT may be electrically connected with the conductive patterns 126 in the contact region CTA. In example embodiments, the contact plugs CT may be positioned on the second insulation pattern 118 having the relatively thick thickness.

As mentioned above, because the cut portion 127 may be formed at the conductive pattern 126 on the second insulation pattern 118, the conductive pattern 126 on the lower surface of the second insulation pattern 118 may be extended to the sidewall and a part of the upper surface of the second insulation pattern 118. Thus, the conductive pattern 126, which may be arranged on one second insulation pattern 118 in the contact region CTA, and the conductive pattern 126, which may be extended from the lower surface of the second insulation pattern 118 to the cut portion 127 on the upper surface, may be connected with each other through the two contact plugs CT having a same height.

In examples of embodiments, the conductive pattern 126 which is disposed on the first insulation pattern 102 and disposed under the second insulation pattern 118 may correspond to a lower word line of a NAND memory stack, the conductive pattern 126 which is disposed on the second insulation pattern 118 may correspond to an upper word line. Further, the first insulation pattern 102 may correspond to a first insulating interlayer for electrically isolating the lower word line and the upper word line. The second insulation pattern 118 may correspond to a second insulating interlayer for electrically isolating the upper word line and the lower word line.

For example, the NAND memory stack may include the first insulating interlayer, a lower word line, a second insulating interlayer and an upper word line sequentially stacked in a cell region and a contact region.

Figure 2A:
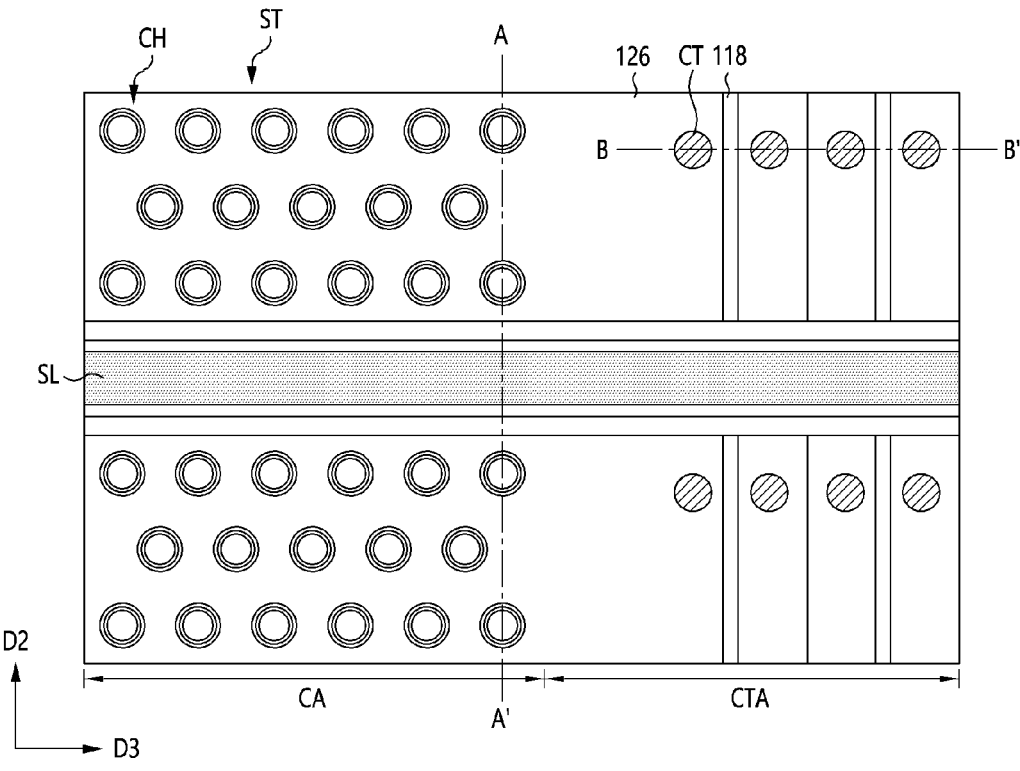
FIGS. 2A to 2C are views illustrating a 3D semiconductor device in accordance with various embodiments.
Figure 2B:
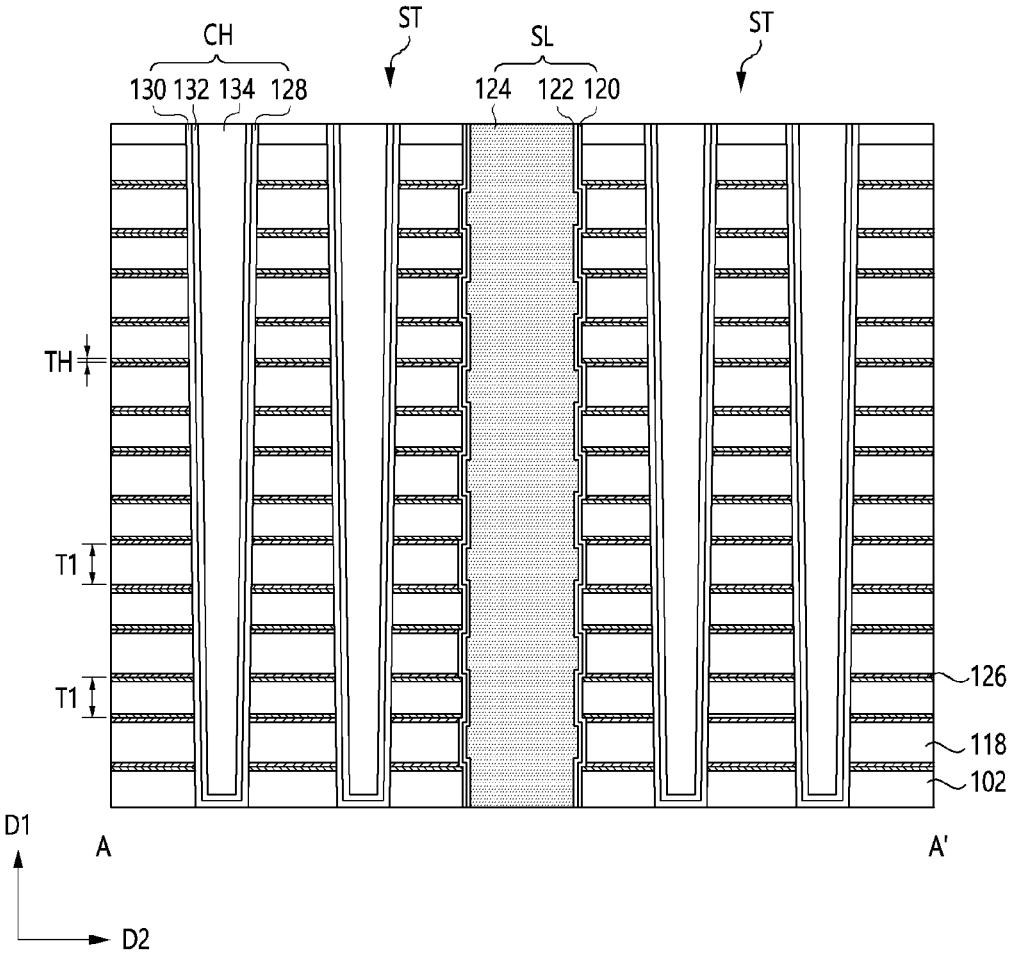
Figure 2C:
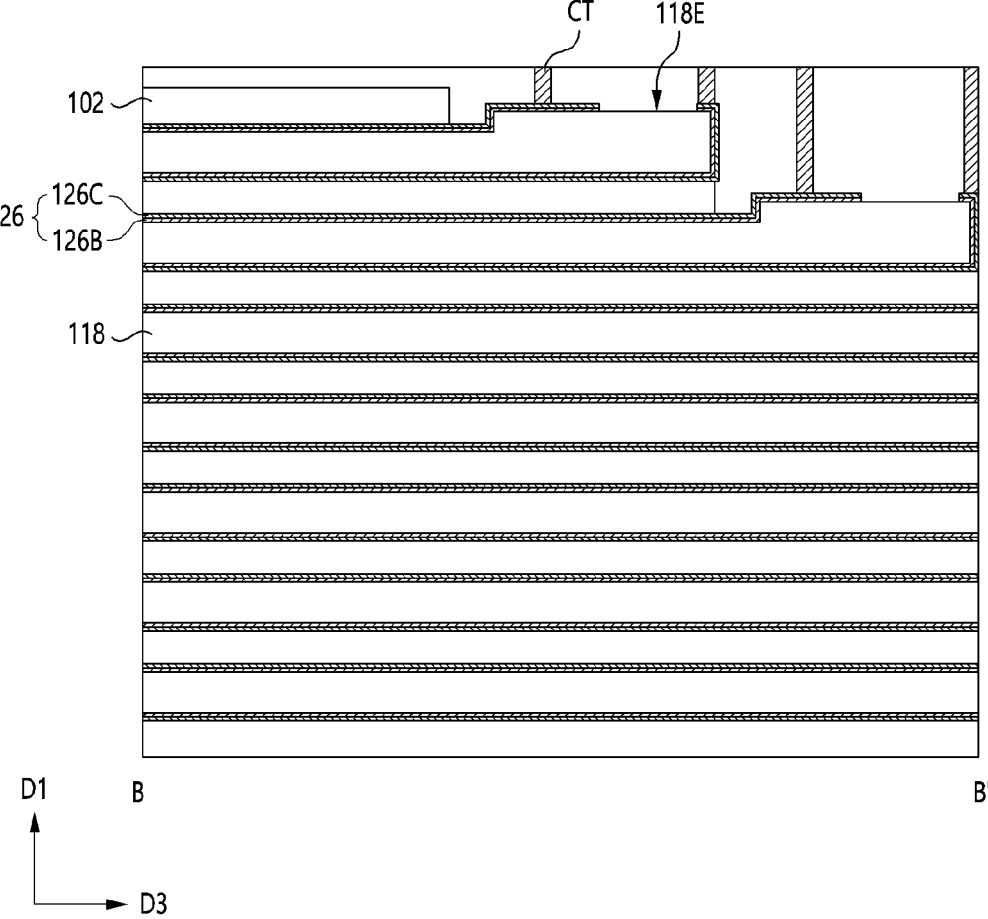

FIGS. 2A to 2C are views illustrating a 3D semiconductor device in accordance with example embodiments, FIG. 2A is a plan view illustrating the 3D semiconductor device, FIG. 2B is a cross-sectional view taken along a line A-A' in FIG. 2A and FIG. 2C is a cross-sectional view taken along a line B-B' in FIG. 2A.

Referring to FIGS. 2A to 2C, a 3D semiconductor device may include a stack structure ST, vertical channel structures CH, and contact plugs CT.

The stack structure ST may include a plurality of conductive patterns 126 and insulation patterns 102 and 118. The conductive patterns 126 may be vertically stacked. The insulation patterns 102 and 118 may be arranged between the conductive patterns 126 to electrically isolate the conductive patterns 126 from each other. The insulation patterns 102 and 118 may include first insulation patterns 102 and second insulation patterns 118. In example embodiments, the stack structure ST may include the first insulation pattern 102, the conductive pattern 126, the second insulation pattern 118, the conductive pattern 126, and the first insulation pattern 102 repeatedly stacked in the vertical direction. For example, each of the conductive pattern 126 may include a barrier layer 126B and a conductive layer 126C stacked on the barrier layer 126B. For example, the barrier layer 126B may contact the first insulation pattern 102. The conductive layer 126C may contact the second insulation pattern 118. The barrier layer 126B may include a TiN layer. The conductive layer 126C may include a tungsten layer.

The 3D semiconductor device in FIGS. 2A to 2C may be substantially the same as the 3D semiconductor device in FIGS. 1A to 1C except for the conductive pattern 126. Thus, any further illustrations with respect to the 3D semiconductor device in FIGS. 2A to 2C may be omitted herein for brevity.

Figure 3:
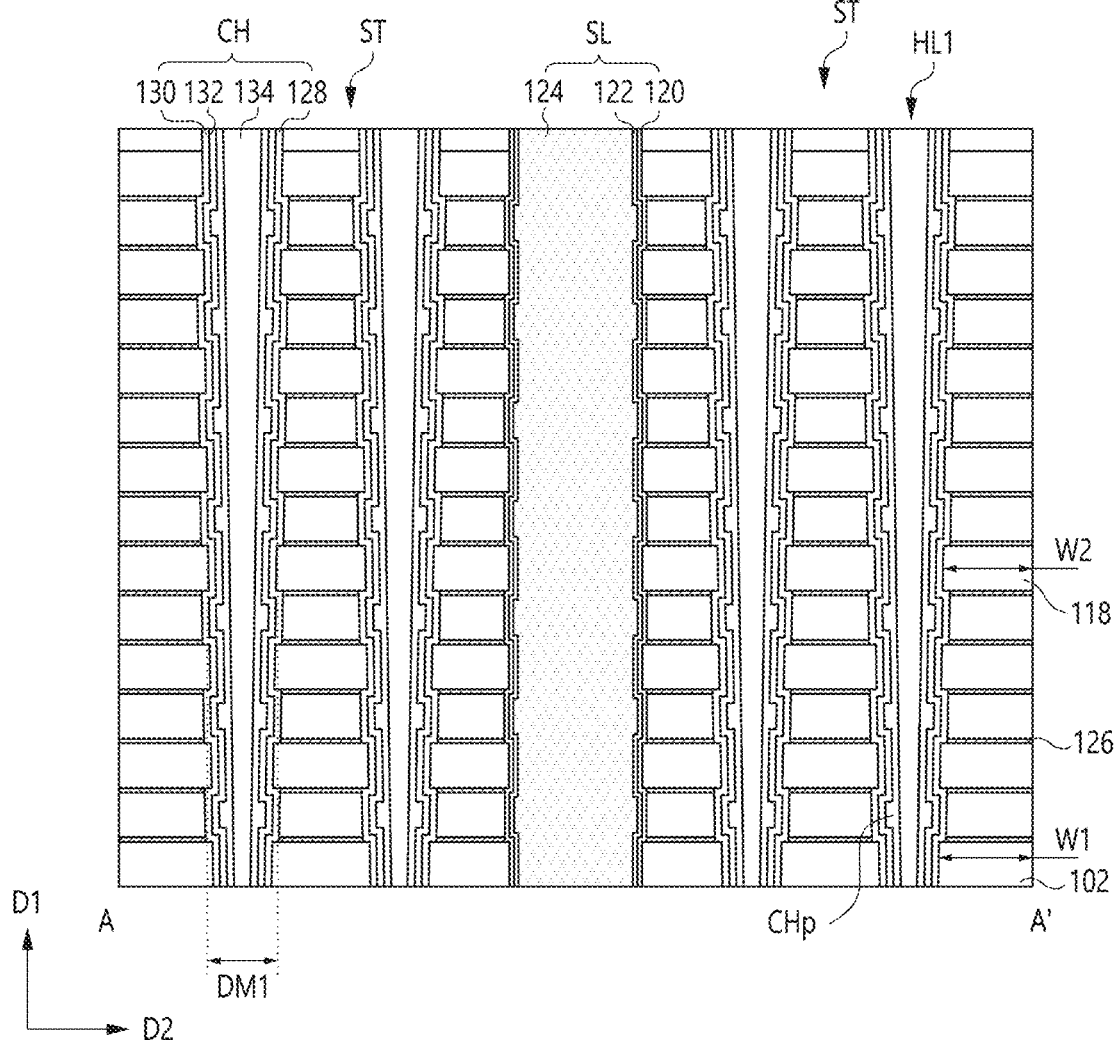
FIG. 3 is a view illustrating a 3D semiconductor device in accordance with various embodiments.

FIG. 3 is a view illustrating a 3D semiconductor device in accordance with example embodiments.

A plan view of the 3D semiconductor device in FIG. 3 may be substantially the same as the 3D semiconductor device in FIG. 1A, Thus, FIG. 3 is a cross-sectional view taken along a line A-A' in FIG. 1A. A contact region of the 3D semiconductor device in FIG. 3 may be substantially the same as the contact region in FIG. 1C, Therefore, drawings with respect to the same structure may be omitted herein for brevity.

Referring to FIG. 3, a 3D semiconductor device may include a stack structure ST, vertical channel structures CH, and contact plugs CT.

The stack structure ST may include a plurality of conductive patterns 126 and insulation patterns 102 and 118, The conductive patterns 126 may be vertically stacked. The insulation patterns 102 and 118 may be arranged between the conductive patterns 126 to electrically isolate the conductive patterns 126 from each other. The insulation patterns 102 and 118 may include first insulation patterns 102 and second insulation patterns 118.

In example embodiments, the first insulation pattern 102 may have a width w1 wider than a width w2 of the second insulation patterns 118 adjacent to the first insulation pattern 102. For example, the width w2 of each of the second insulation patterns 118 may be narrower than the width w1 of the first insulation pattern 102. The first insulation pattern 102 may be protruded between the adjacent two second insulation patterns 118. The width may correspond to a length along the second direction D2 in drawings.

Each of the conductive patterns 126 may have a width substantially the same as the width of the second insulation pattern 118. Thus, a concave recessed portion may be defined by a difference between the width W1 of the first insulation patterns 102 and the width W2 of the second insulation pattern 118.

In FIG. 3, the conductive pattern 126 may be formed of a single conductive layer or a stack layer including a barrier layer and a conductive layer stacked on the barrier layer. The conductive patterns 126 may include a metal material for example, tungsten (W) or molybdenum (Mo). The conductive patterns 126 may include a doped polysilicon including conductive impurities, but are not limited thereto.

Each of the vertical channel structures CH may include a channel 134 and memory layers 128, 130 and 132 configured to surround the channel 134, The memory layers 128, 130 and 132 may be interposed between the channel 134 and the conductive pattern 126. The memory layers 128, 130 and 132 may include a tunnel insulation layer 132 configured to surround the channel 134, a data storage layer 130 configured to surround the tunnel insulation layer 132 and a blocking insulation layer 128 configured to surround the data storage layer 130.

In a vertical cross-sectional view, each of the vertical channel structures CH may have a structure corresponding to the recessed portion between the adjacent two first insulation patterns 102, That is, each of the vertical channel structures CH may have protruded portions CHp toward the recessed portion. For example, the memory layers 128, 130 and 132 may partially protrude. The protrusions CHp may be provided to a portion of each of the vertical channel structure CH corresponding to the second insulation pattern 118.

The 3D semiconductor device in FIG. 3 may be substantially the same as the 3D semiconductor device in FIGS. 1A to 1C except for the first insulation patterns 102 and the second insulation patterns 118 and the structure of the vertical channel structure CH. Thus, any further illustrations with respect to the 3D semiconductor device in FIG. 3 may be omitted herein for brevity.

Hereinafter, a method of manufacturing a 3D semiconductor device in accordance with example embodiments may be illustrated with reference to drawings.

FIGS. 4A, 43, 5, 6A, 6B, 7A, 73, 8A, 83, 9, 10, 11, 12A, and 12B are cross-sectional views illustrating a method of manufacturing a 3D semiconductor device in accordance with example embodiments, FIGS. 4A, 5, 6A, 7A, 8A, 9, 10, 11, and 12A may show a method of manufacturing the 3D semiconductor device in a cell region. FIGS. 43, 63, 7B, 83, and 12B may show a method of manufacturing the 3D semiconductor device in a contact region.

Figure 4A:
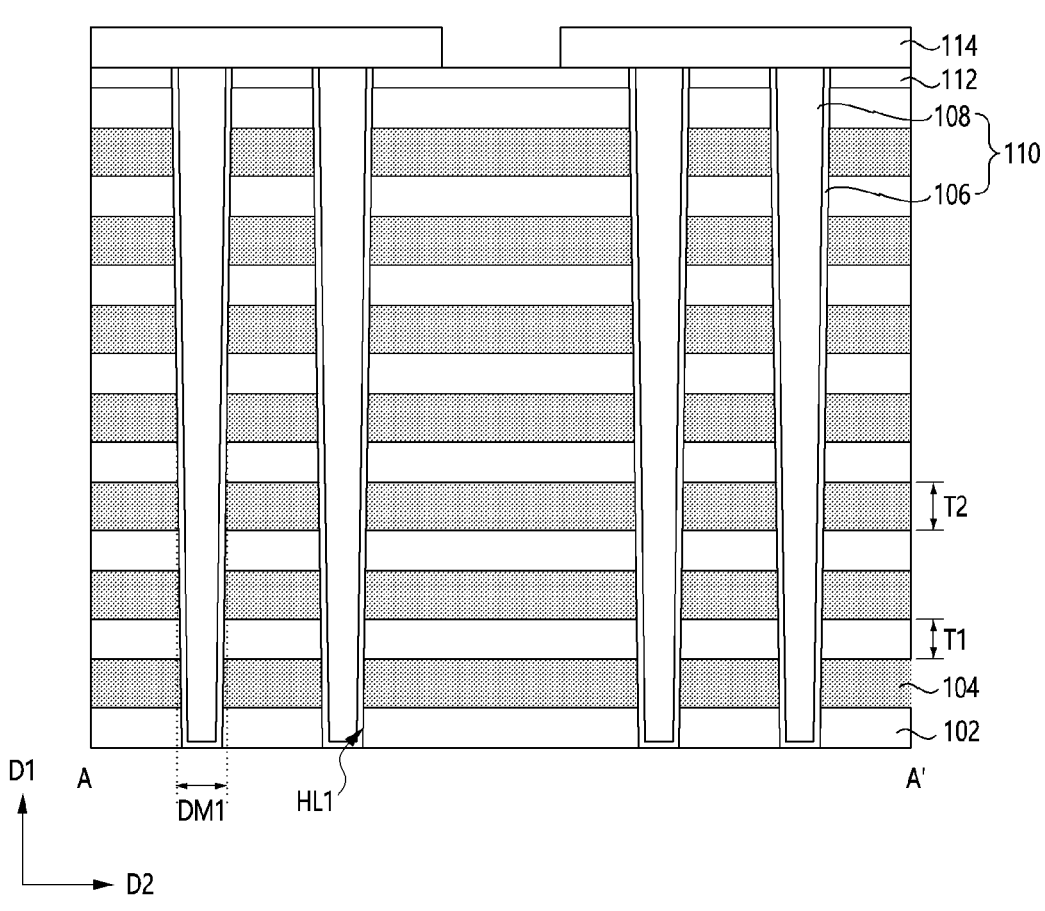
FIGS. 4A, 4B, 5, 6A, 6B, 7A, 7B, 8A, 8B, 9, 10, 11, 12A, and 12B are cross-sectional views illustrating a method of manufacturing a 3D semiconductor device in accordance with various embodiments.
Figure 4B:
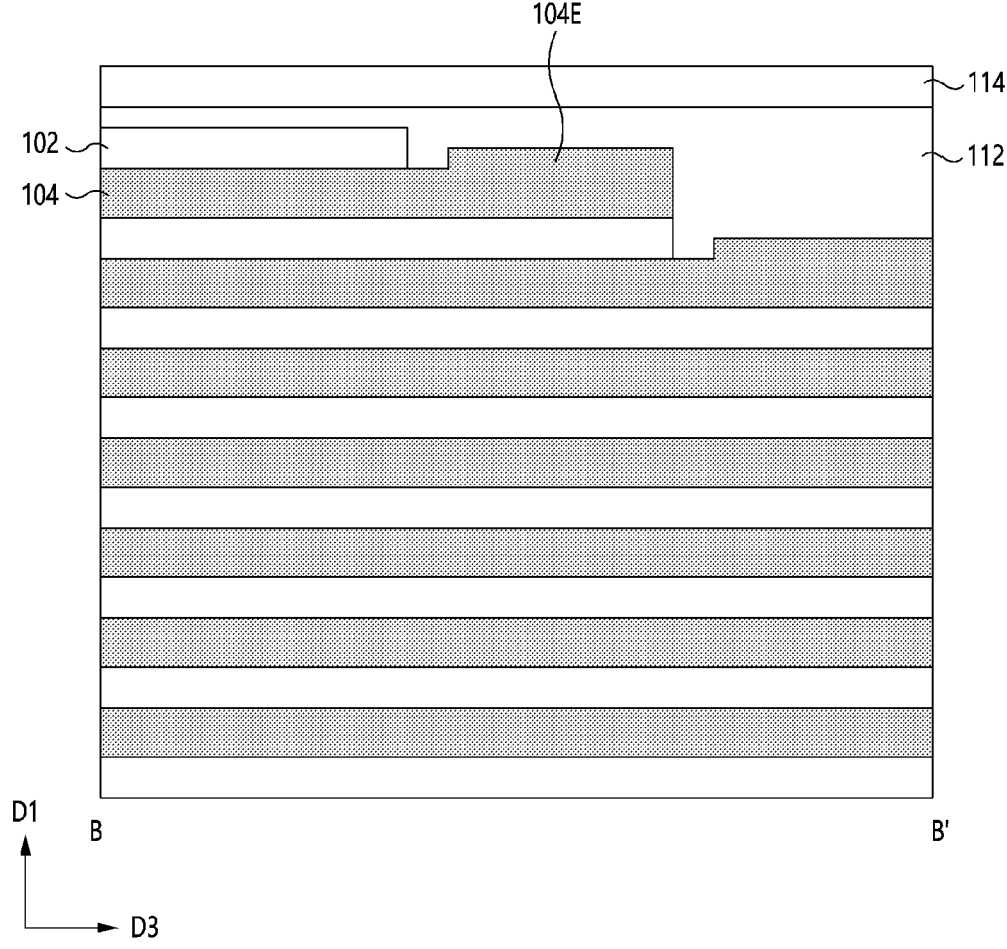

Referring to FIGS. 4A and 4B, a plurality of pillar patterns 110 may be formed through a stack structure ST. The stack structure ST may include a plurality of first insulation patterns 102 and a plurality of sacrificial patterns 104 alternately stacked.

Particularly, the first insulation patterns 102 and the sacrificial patterns 104 may be alternately stacked to form the stack structure ST. The stack structure ST may be formed in the cell region CA and the contact region CTA.

For example, the first insulation patterns 102 may include a silicon oxide material, but are not limited thereto. The sacrificial patterns 104 may include a material having an etching selectivity with respect to an etchant for the first insulation pattern 102. For example, the sacrificial pattern 104 may include a silicon nitride material, but are not limited thereto.

The first insulation pattern 102 may have a first thickness T1. The sacrificial pattern 104 may have a second thickness T2. The first thickness T1 may be thinner than the second thickness T2. In example embodiments, the first thickness T1 may be about 2 times a thickness of a preliminary conductive pattern.

A thickness of the end 104E of the sacrificial patterns 104 in the contact region CTA may be thicker than a thickness of the sacrificial pattern 104 in the cell region CA. A sacrificial layer in a deposition process may have a thickness thicker than the second thickness T2. The sacrificial layer may be etched to provide the sacrificial pattern 104 in a region except for the contact region CTA with the second thickness T2. For example, the thickness T2 of the sacrificial layer may be a sum of the first thickness T1 and about two times a thickness of a conductive layer to be formed later.

The stack structure ST may be partially etched to form a plurality of first holes HL1 in the cell region CA. The first holes HL1 may be formed through the stack structure ST in a direction substantially perpendicular to a surface of a substrate (hereinafter, referred to as a first direction D1). In example embodiments, each of the first holes HL1 may have a first diameter DM1. The first hole HL1 may have downwardly decreasing diameters. The first diameter DM1 may be an average diameter of the downwardly decreasing diameters. The contact region CTA may be masked during the first holes HL1 may be formed in the cell region CA.

The first holes HL1 may be filled with layers to form the pillar patterns 110. The pillar patterns 110 may include a plurality of layers 106 and 108. The layers 106 and 108 may include a first layer 106 and a second layer 108. The first layer 106 may be conformally formed on a surface of the stack structure ST. The second layer 108 may be formed in the first hole HL1 with the first layer 106. The first layer 106 may include silicon oxide. The second layer 108 may include polysilicon.

A mask pattern 114 configured to partially expose the stack structure ST may be formed on the stack structure ST with the pillar patterns 110. The mask pattern 114 may include a photoresist pattern.

As shown in drawings, an insulating interlayer 112 may be formed between the stack structure ST and the mask pattern 114. The insulating interlayer 112 may include a material having an etching selectivity with respect to an etchant for the sacrificial pattern 104. For example, the insulating interlayer 112 may include oxide. Alternatively, the formation of the insulating interlayer 112 may be omitted.

Figure 5:
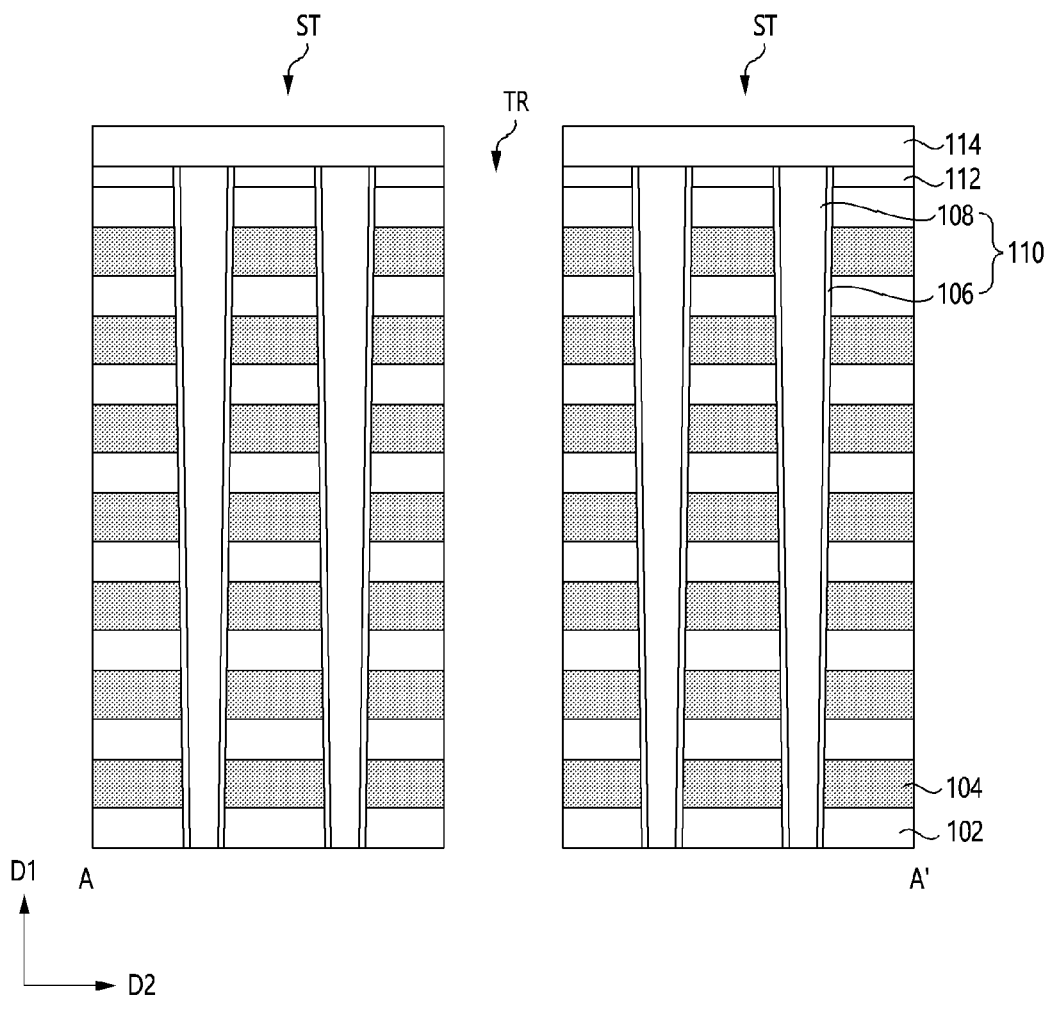

Referring to FIG. 5, the insulating interlayer 112 may be etched using the mask pattern 114. The stack structure ST may be etched using the mask pattern 114 and the etched insulating interlayer 112 as an etch mask to form a trench TR.

The trench TR may be extended along a third direction D3. The trench TR may divide the stack structure ST into two stack structures ST along the second direction D2.

The trench TR may be formed in the cell region CA. The contact region CTA may be masked during the trench TR may be formed. After forming the trench TR, the mask pattern may then be removed.

Figure 6A:
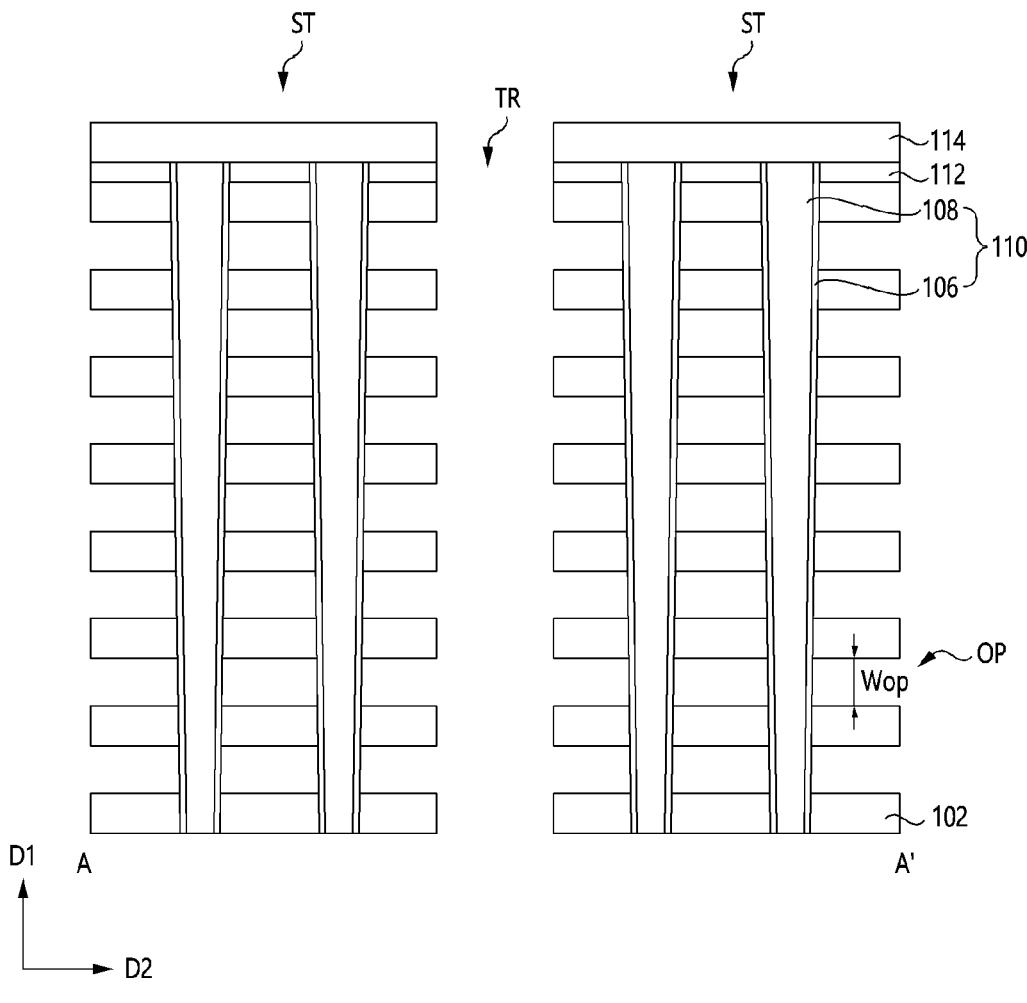
Figure 6B:
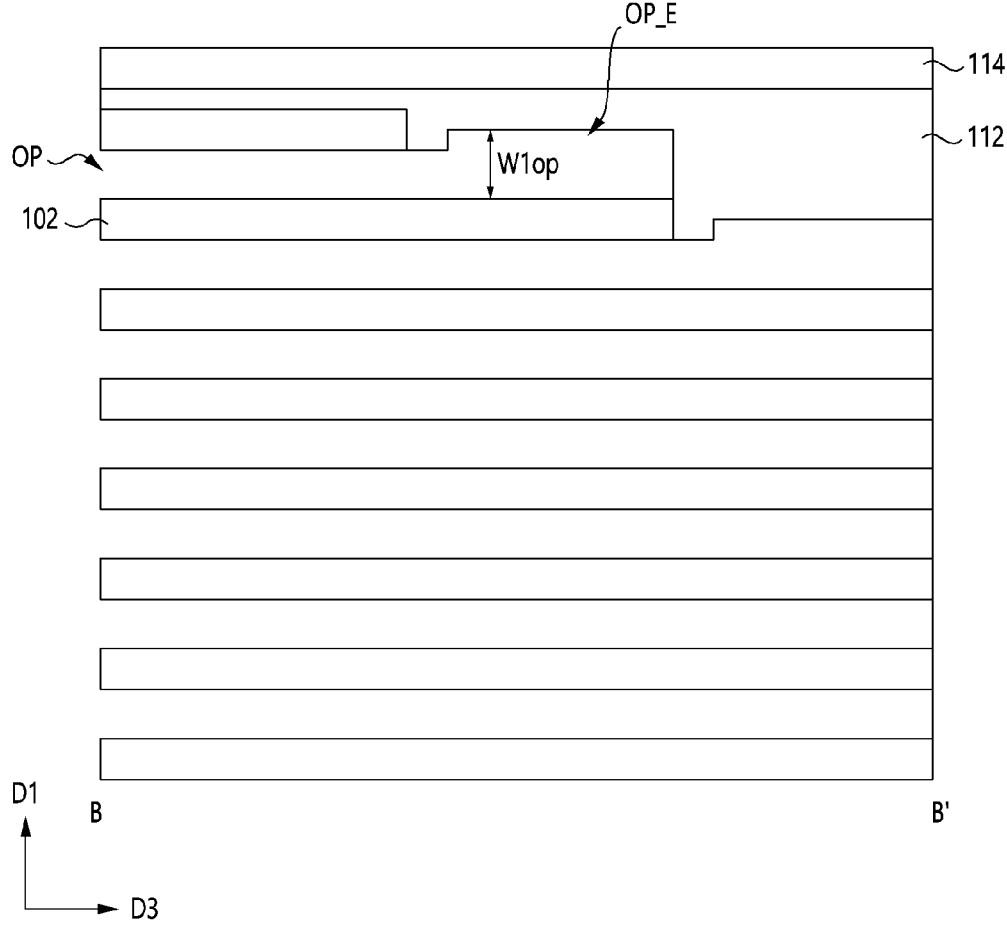

Referring to FIGS. 6A and 6B, the exposed sacrificial patterns 104 may be removed to form openings OP between the adjacent first insulation patterns 102. As mentioned above, the sacrificial patterns 104 may include the material having an etching selectivity with respect to the etchant for the first insulation patterns 102. Thus, only the sacrificial patterns 104 may be removed using the etchant.

Because the sacrificial patterns 104 may have the second thickness T2, widths Wop of the openings OP in the cell region CA may be the same as the second thickness T2, referring to FIG. 6A.

All the sacrificial patterns 104 in the cell region CA and the contact region CTA may be removed. Particularly, because the end portion 104E of each of the sacrificial patterns 104 in the contact region CTA may be thicker than other regions (for example the cell region CA), an end portion OP_E of each of the openings OP in the contact region CTA may have a width W1op wider than a width of other portions, referring to FIG. 6B.

Figure 7A:
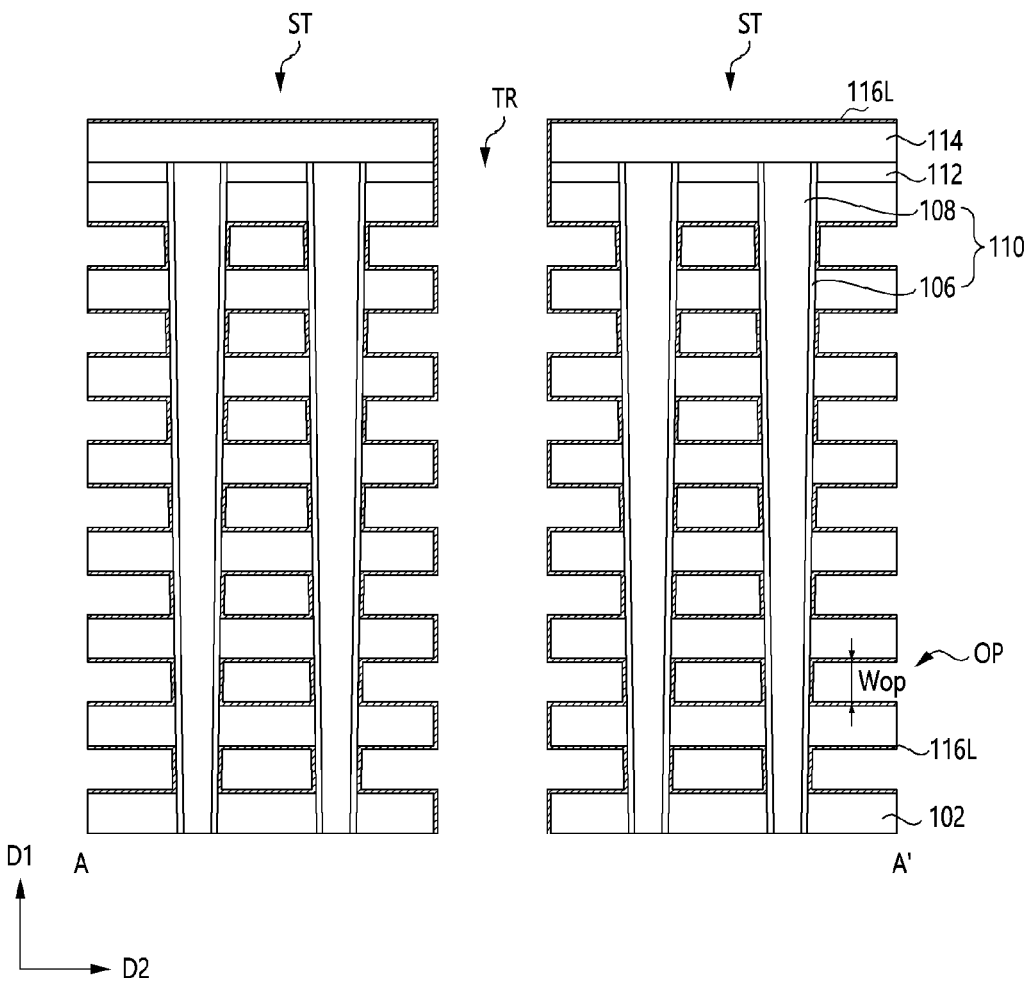
Figure 7B:
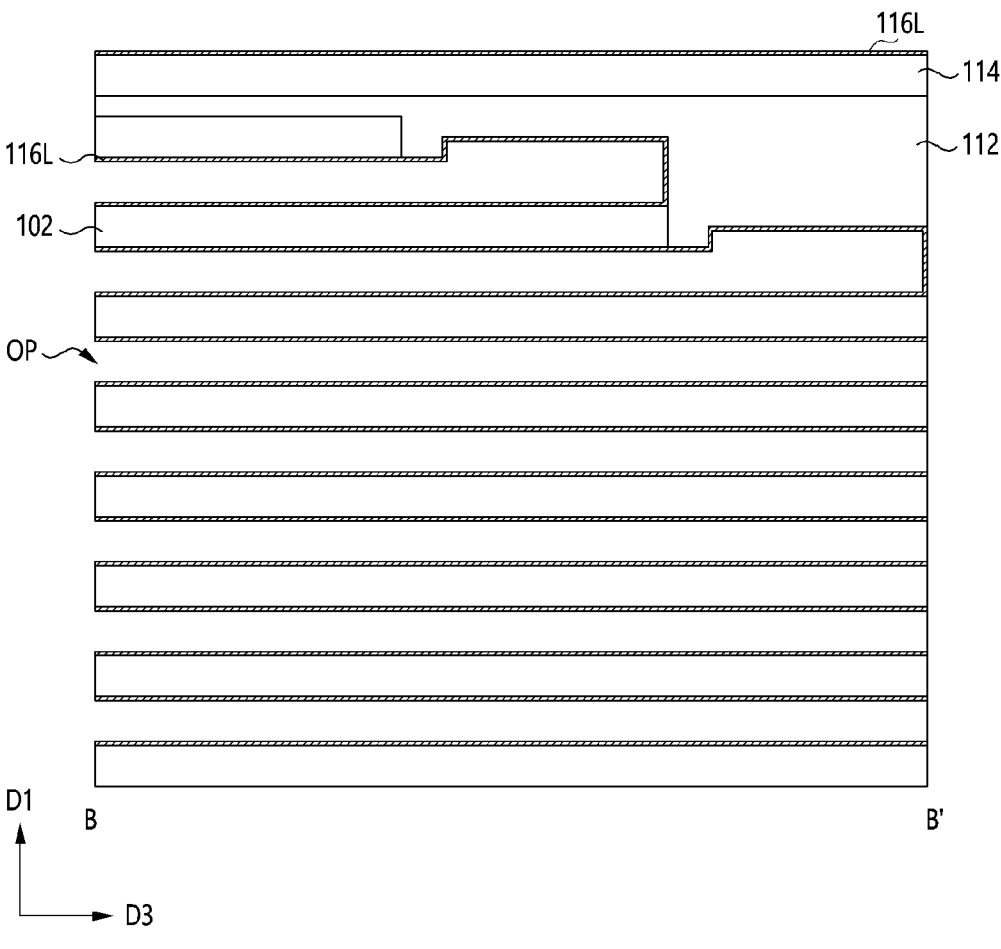

Referring to FIGS. 7A and 7B, a conductive layer 116L may be conformally formed on an exposed surface of the openings OP in the stack structure ST. The conductive layer 116L may be formed in the cell region CA and the contact region CTA.

The conductive layer 116L may include a metal such as tungsten, molybdenum, etc., or polysilicon including conductive impurities. When the conductive layer 116L may include the tungsten, the tungsten may have a minimum thickness that can be deposited with a deposition apparatus such as ALD (atomic layer deposition) or PEALD (plasma enhanced atomic layer deposition), used for a step of depositing a thin film. For example, a thickness of the conductive layer 116L may be determined by the second thickness TH and a resistance of a word line. At that time, the conductive layer 116L may be formed to have a thickness not to fill the openings OP. Alternatively, the conductive layer 116L may further include a barrier layer between the conductive layer 116L and the first insulation pattern 102. For example, the barrier layer may include a titanium nitride material. As above, the barrier layer may be used when the conductive layer may be a metal layer other than Molybdenum (Mo).

Figure 8A:
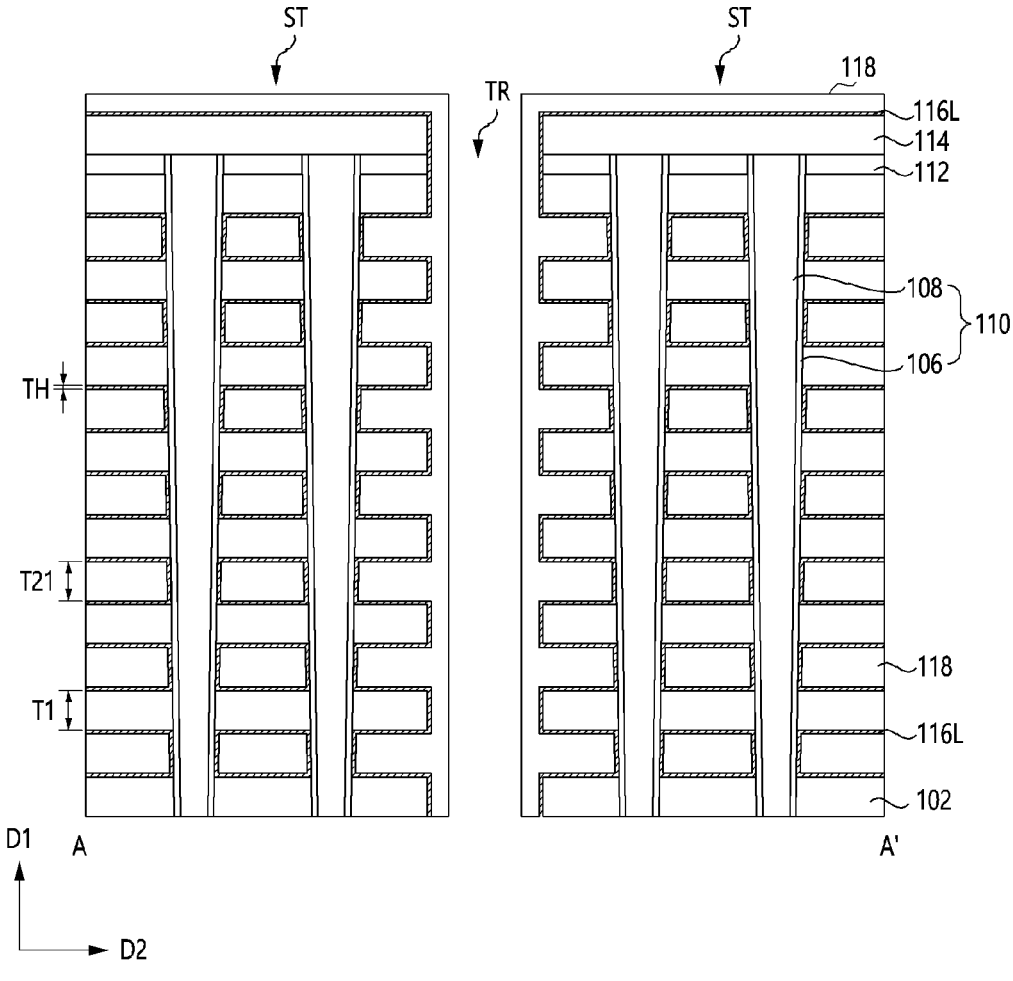
Figure 8B:
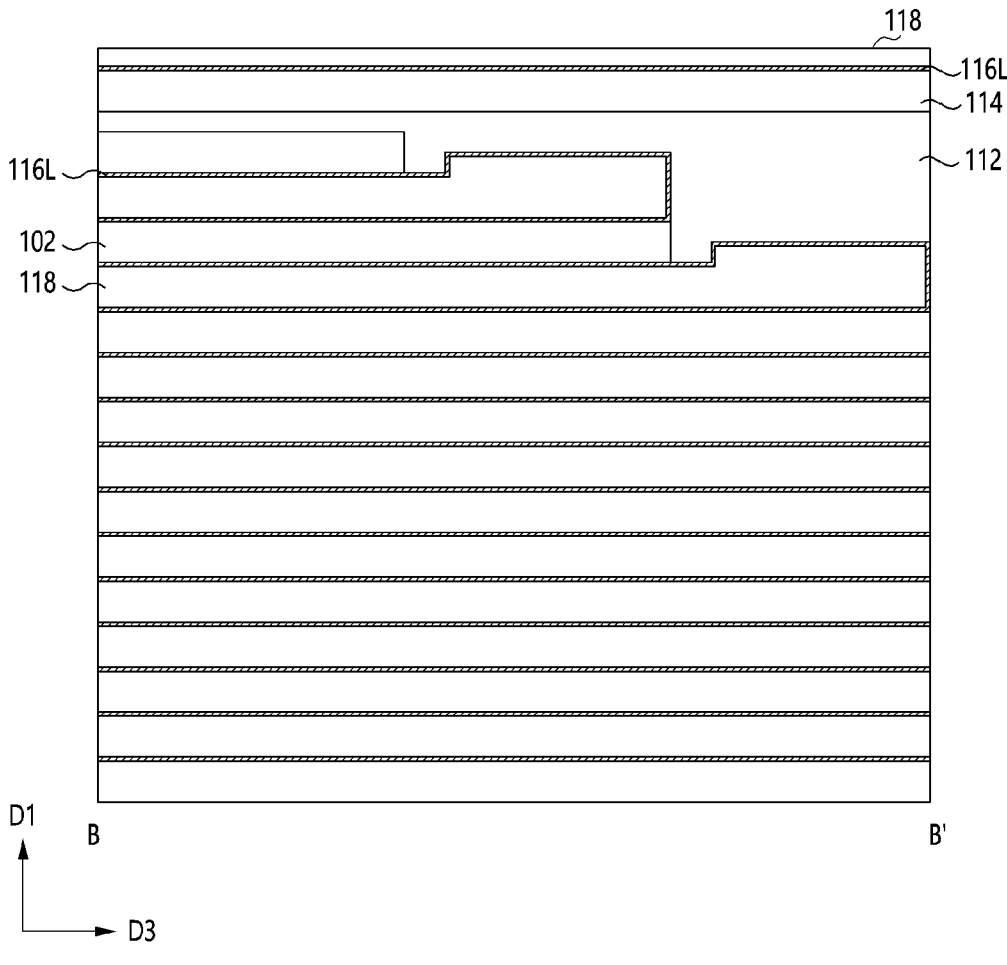

Referring to FIGS. 8A and 8B, the openings OP with the conductive layer 116L may be filled with second insulation patterns 118. The second insulation patterns 118 may be formed in the cell region CA and the contact region CTA. An end portion 118E of each of the second insulation patterns 118 in the contact region may have a thickness thicker than a thickness of other portions.

For example, the second insulation patterns 118 may include at least one of oxide, nitride, and oxynitride. In example embodiments, the second insulation patterns 118 may have the same material as the first insulation patterns 102. Alternately, the second insulation patterns 118 may have a material different from the first insulation patterns 102. In example embodiments, although the first and the second insulation patterns 102 and 118 may include a silicon oxide material, a process for forming the second insulation pattern 118 and a process for forming the first insulation pattern 102 may be different, or a property of the second insulation pattern 118 and a property of the first insulation pattern 102 may be different. The property of the present embodiment may include at least one of a type (or kind) of a material, a dielectric constant (or permittivity) of the material, an insulating intensity of the material, a hardness of the material, a component ratio (or stoichiometric ratio)

of the material, a transmittance of the material, or a difference depending on depositing methods the materials. But, the property is not limited to those listed above.

As mentioned above, the width Wop of the opening OP may be substantially the same as the second thickness T2 as shown in FIG. 6A. The conductive layer 116L may be formed along surfaces of the openings OP to have a conformally thickness TH. For example, the thickness TH of the conductive layer 116L may be thinner than half of the second thickness T2, Thus, a thickness T21 of the second insulation patterns 118 which is filled in the openings OP may be thinner than the second thickness T2. In examples of the embodiments, the second thickness T2 may be set to be thicker than the first thickness T1 considering the thickness TH of the conductive layer 116L, so that the thickness T21 of the second insulation pattern 118 and the thickness T1 of the first insulation pattern 102 may be the same.

Figure 9:
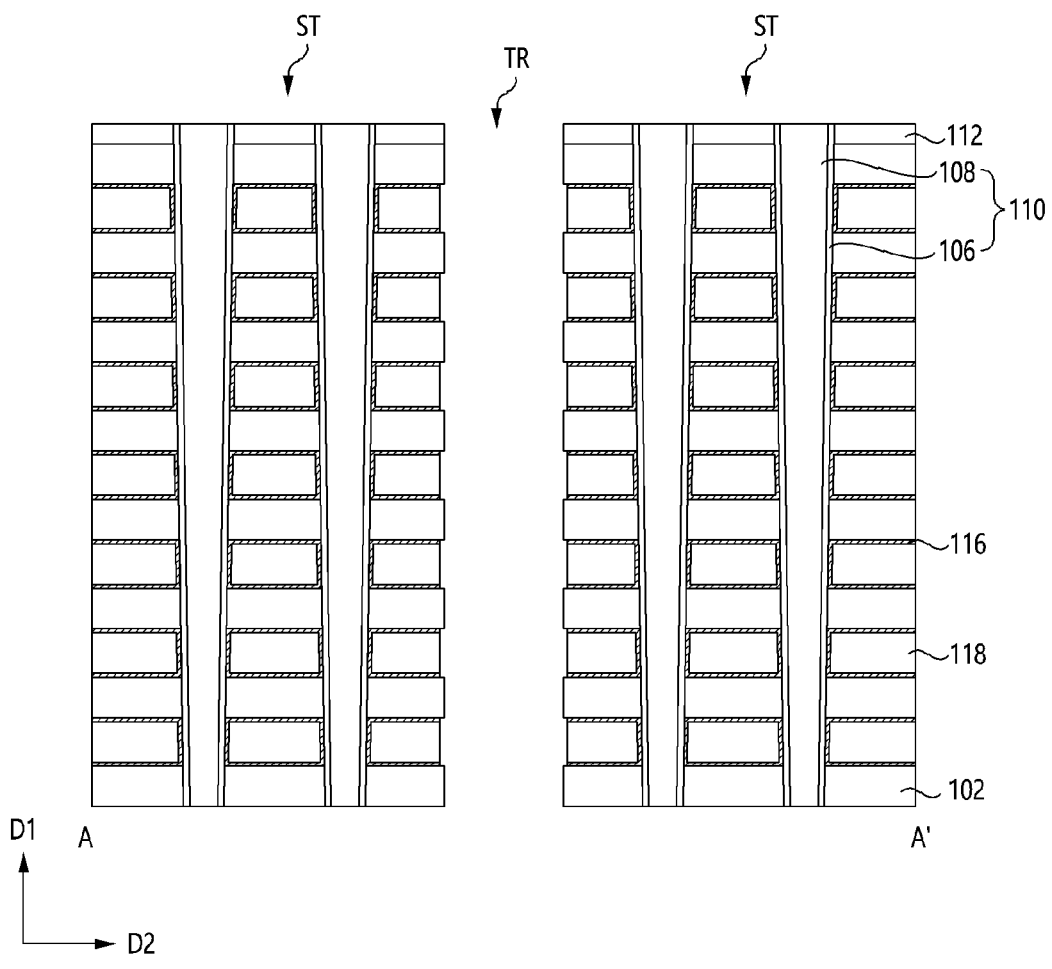

Referring to FIG. 9, the conductive layer exposed through the trench TR may be etched to form preliminary conductive patterns 116, The etching of the conductive layer exposed through the trench TR may electrically isolate the stack structures ST from each other.

Any one of the preliminary conductive patterns 116 may be configured to surround the sidewall of the second insulation pattern 118. That is, in a cross-sectional view, the preliminary conductive patterns 116 may be configured to surround the lower surface, the upper surface, and the side surface of the second insulation pattern 118.

Figure 10:
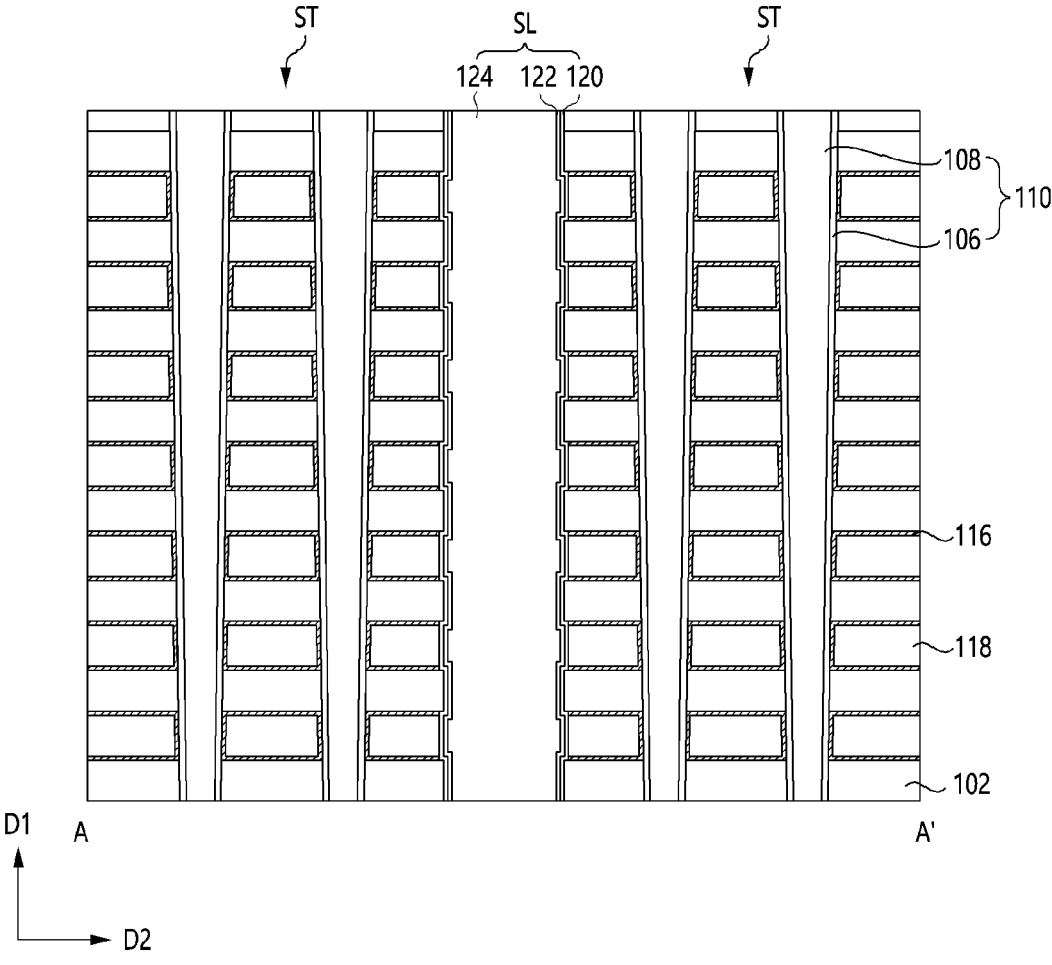

Referring to FIG. 10, a slit structure SL may be formed in the trench TR, In example embodiments, insulation spacers 120 and 122 may be conformally formed on an inner surface of the trench TR, The trench TR with the insulation spacers 120 and 122 may be filled with a conductive material to form a source contact plug 124. Alternatively, the trench TR may be filled with an insulation material to form the insulation spacers 120 and 122.

Figure 11:
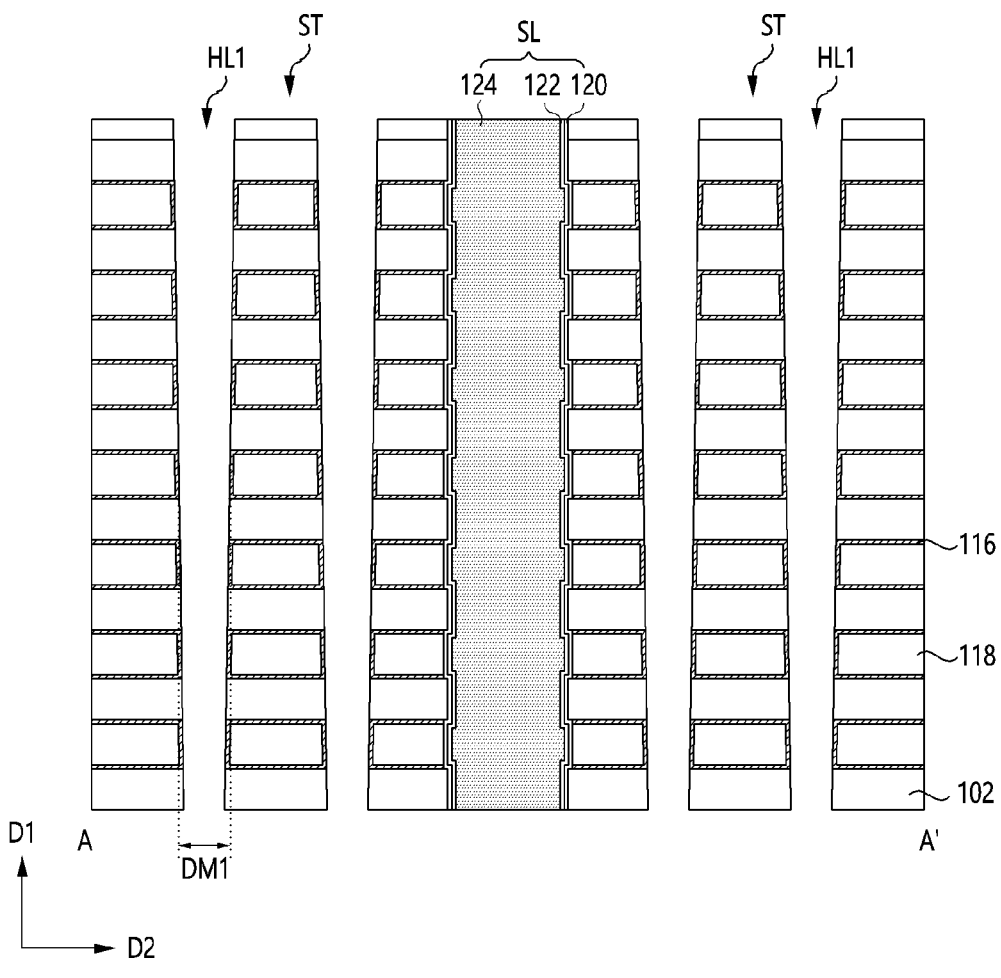

Referring to FIG. 11, the pillar patterns 110 in the cell region CA may be removed to define the first holes HL1 of each of the stack structures ST. As mentioned above, each of the first holes HL1 may have the first diameter DM1. Each of the preliminary conductive patterns 116 exposed through the first holes HL1 may be configured to surround the lower surface, the upper surface, and the side surface of the second insulation pattern 118.

Figure 12A:
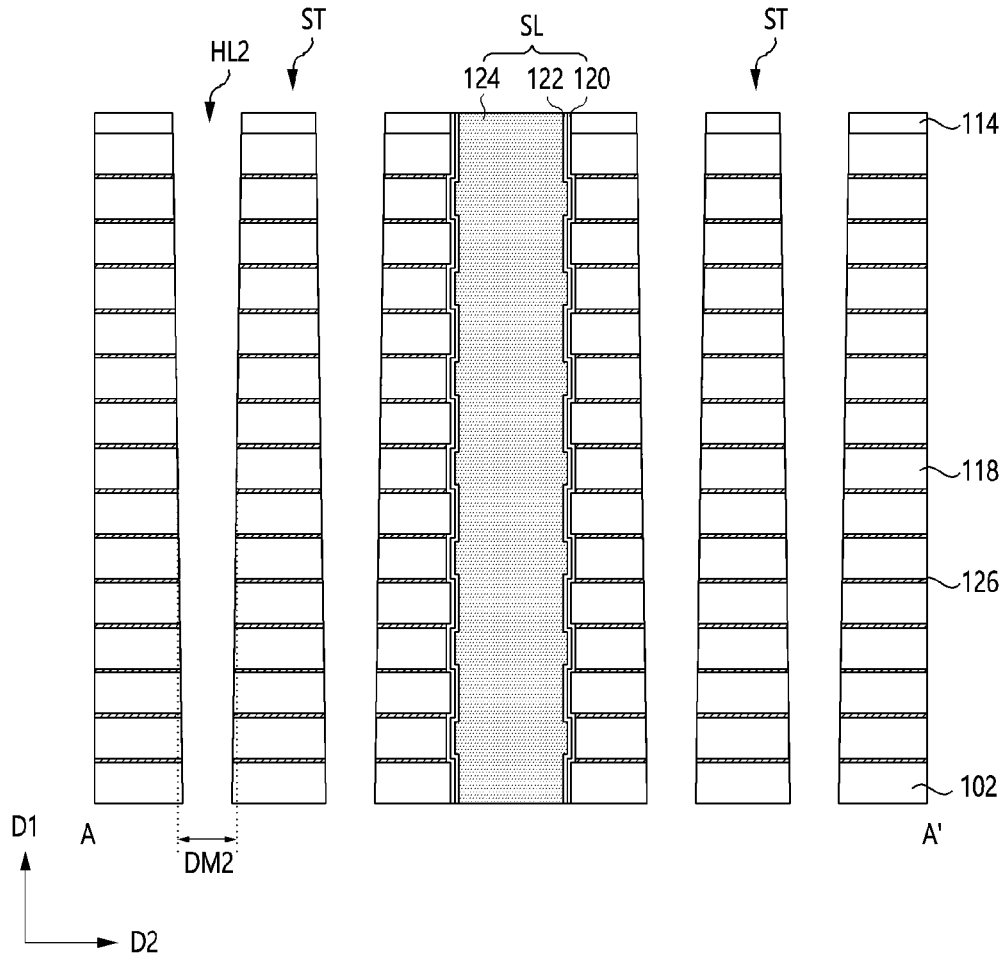
Figure 12B:
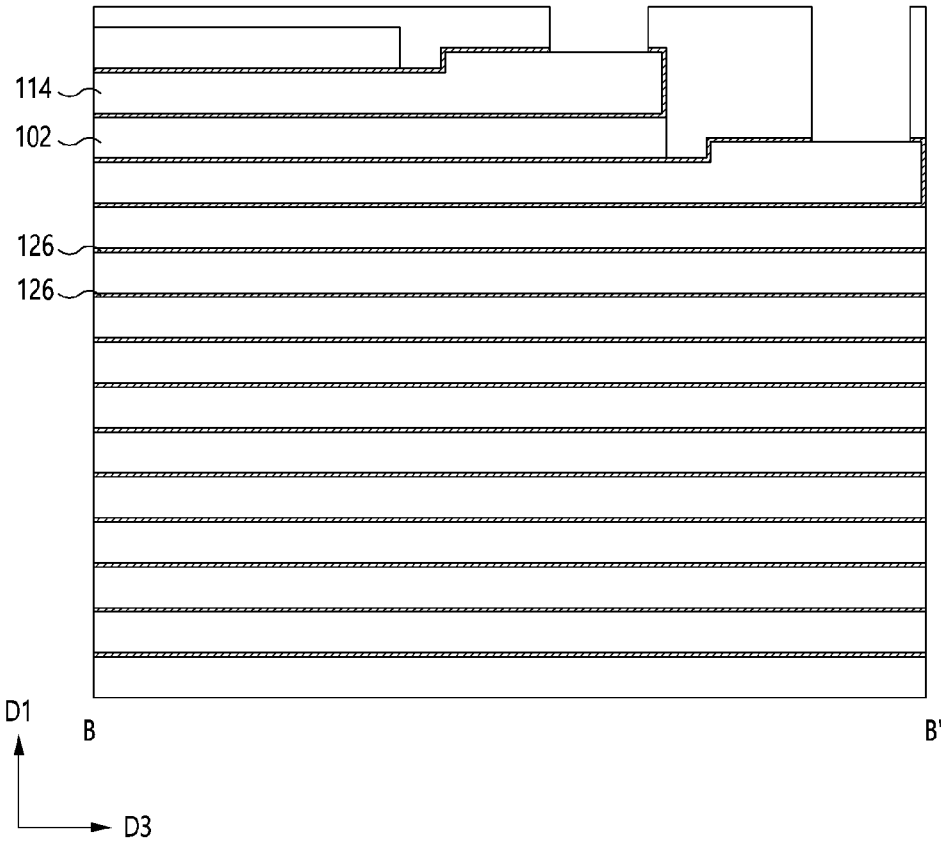

Referring to FIGS. 12A and 12B, side surfaces of the preliminary conductive patterns 116 exposed through the first holes L1 may be etched to form second holes HL2, Each of the second holes HL2 may have a second diameter DM2 longer than the first diameter DM1.

By forming the second holes HL2, one preliminary conductive pattern 116 may be divided into an upper conductive pattern 126 and a lower conductive pattern 126.

During the side surfaces of the preliminary conductive patterns exposed through the first holes HL1 in the cell region CA may be etched, the preliminary conductive patterns 116 formed at the end portion 118E of the second insulation pattern 118 may be partially etched to divide the preliminary conductive patterns 116 into the two conductive patterns 126.

Thus, the preliminary conductive patterns 116 may be divided into the upper and lower conductive patterns 126 to form the 3D semiconductor device having a high integration degree in a same area.

Referring again to FIG. 1B, the vertical channel structures CH may be formed in the second holes HL2 in the cell region CA.

Particularly, the memory layers 128, 130, and 132 may be conformally formed on inner surfaces of the second holes HL2. The memory layers 128, 130, and 132 may be formed by sequentially stacking the blocking insulation layer 128, the data storage layer 130 and the tunnel insulation layer 132. The channel 134 may be formed in the second holes HL2 with the memory layers 128, 130, and 132.

Referring to FIG. 1C, a plurality of the contact plugs CT may be electrically connected with the conductive patterns 126 in the contact region CTA.

Figure 13:
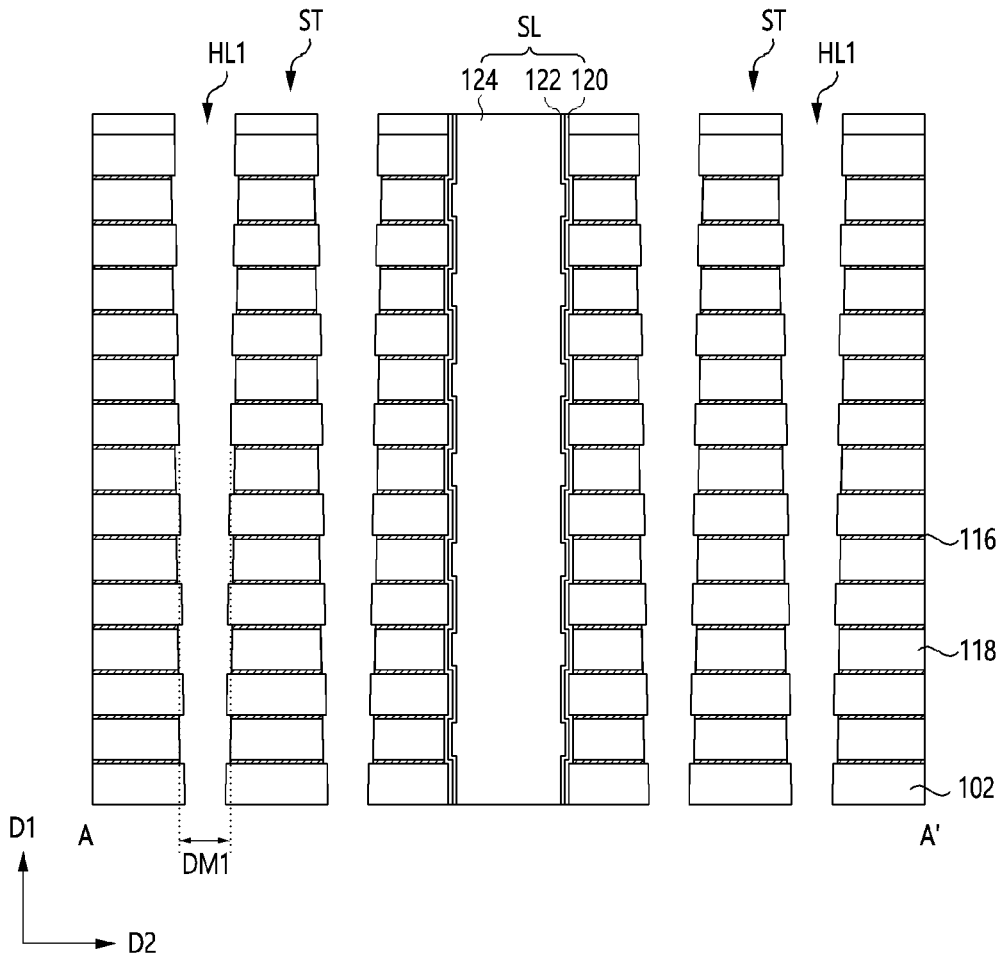
FIG. 13 is a cross-sectional view illustrating a method of manufacturing a 3D semiconductor device in accordance with various embodiments.

FIG. 13 is a cross-sectional view illustrating a method of manufacturing a 3D semiconductor device in accordance with example embodiments.

The structure in FIG. 11 may be formed the processes illustrated with reference to FIGS. 4A, 4B, 5, 6A, 6B, 7A, 7B, 8A, 8B, 9, 10, and 11.

Referring to FIG. 13, the side surfaces of the preliminary conductive patterns 116 exposed through the first holes HL1 may be wet etched. That is, portions of the preliminary conductive patterns 116 covered by the first insulation patterns 102 and the second insulation patterns 118 might not be etched. In contrast, only the side surfaces of the preliminary conductive patterns 116 exposed through the first holes HL1 may be etched. Thus, by selectively etching the side surfaces of the preliminary conductive patterns 116, one preliminary conductive pattern 116 may be electrically divided into an upper conductive pattern and a lower conductive pattern. As a result, each of the preliminary conductive patterns 116 may be divided into the upper and lower conductive patterns 126 to form the 3D semiconductor device having a high integration degree in a same area.

In example embodiments, a size of the first hole HL1 may be partially expanded. However, the size of the first hole HL1 may be maintained.

Referring again to FIG. 3, the vertical channel structures CH may be formed in the first holes HL1. The vertical channel structure CH may have a shape corresponding to a shape of the first hole HL1.

Figure 14:
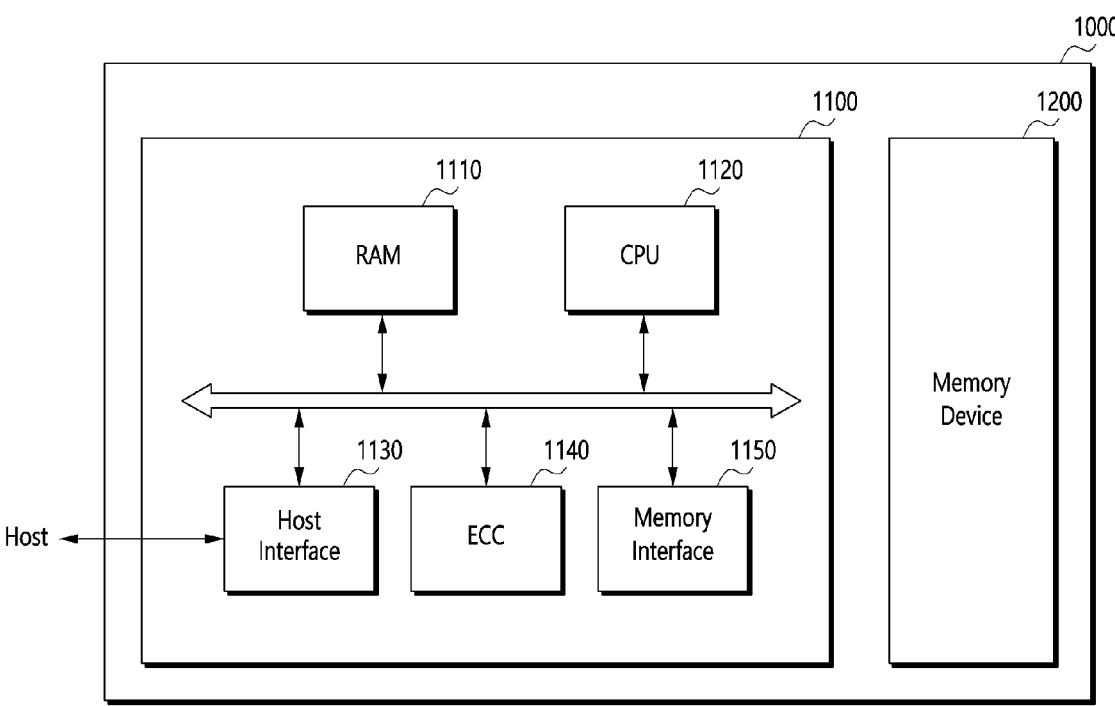
FIG. 14 is a block diagram illustrating a memory system in accordance with various embodiments.

FIG. 14 is a block diagram illustrating a memory system in accordance with various embodiments.

As illustrated in FIG. 14, a memory system 1000 may include a memory device 1200 and a controller 1100.

The memory device 1200 may be used to store various data types such as text, graphic and software code. The memory device 1200 may be a non-volatile memory. In an embodiment, the memory device 1200 may improve an integration density of stacked word lines by the preliminary conductive pattern surrounding the insulation pattern, as shown in FIG. 1A to FIG. 13.

The controller 1100 may be couple to a host and the memory device 1200, and the controller 1100 may access the memory device 1200 in response to a request from the host. For example, the controller 1100 may control read, write, erase, and background operations of the memory device 1200.

The controller 1100 may include random access memory (RAM) 1110, a central processing unit (CPU) 1120, a host interface 1130, an error correction code (ECC) circuit 1140, and a memory interface 1150.

The RAM 1110 may function as operation memory of the CPU 1120, cache memory between the memory device 1200 and the host, and buffer memory between the memory device 1200 and the host. The RAM 1110 may be replaced by static random access memory (SRAM) or read only memory (ROM).

The host interface 1130 may be interface with the host. For example, the controller 1100 may communicate with the host through one of various interface protocols with a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1140 may detect and correct errors included in data read from the memory device 1200 by using error correction codes (ECCs).

The memory interface 1150 may interface with the memory device 1200, For example, the memory interface 1150 may include a NAND interface or a NOR interface.

For example, the controller 1100 may further include buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

Figure 15:
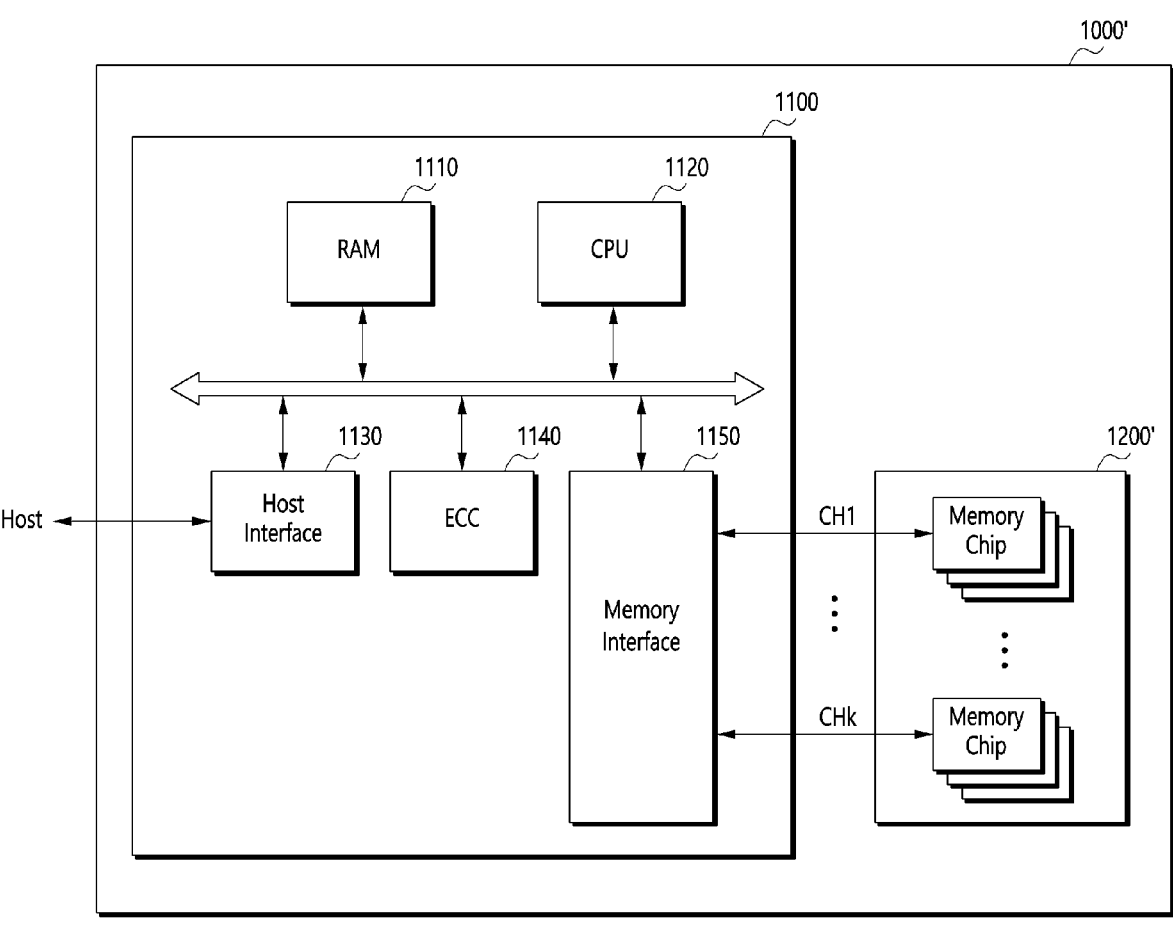
FIG. 15 is a block diagram illustrating a memory system in accordance with various embodiments.

FIG. 15 is a block diagram illustrating a memory system in accordance with various embodiments.

As illustrated in FIG. 15, a memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200, in an embodiment, may improve an integration density of stacked word lines by the preliminary conductive pattern surrounding the insulation pattern, as shown in FIG. 1A to FIG. 13.

In addition, the memory device 1200' may be a multi-chip package composed of a plurality of memory chips. The plurality of memory chips may have the stack structures ST of FIG. 1A to FIG. 13.

As described above, in an embodiment, a property of the memory system 1000' can be improved, because the memory system includes the memory device 1200 including at least one stack structure improved the integrated density of the word lines, as shown in FIG. 1A to FIG. 13.

Figure 16:
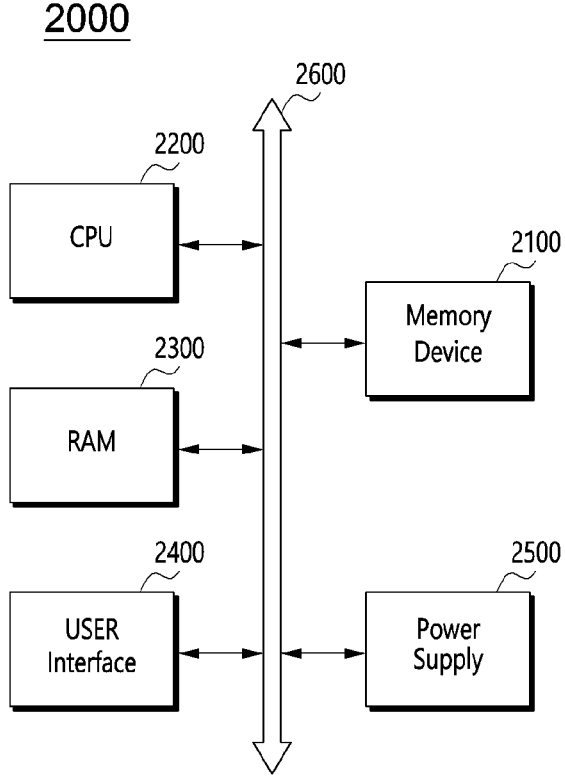
FIG. 16 is a block diagram illustrating a computing system in accordance with various embodiments.

FIG. 16 is a block diagram illustrating a computing system in accordance with various embodiments.

As illustrated in FIG. 16, a computing system 2000 may include a memory device 2100, a CPU 2200, random-access memory (RAM) 2300, a user interface 2400, a power supply 2500, and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100, in an embodiment, may improve an integration density of stacked word lines by the preliminary conductive pattern surrounding the insulation pattern, as shown in FIG. 1A to FIG. 13.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, in an embodiment, a property of the computing system 2000 can be improved by improving the integrated density of the word lines of the memory device 1200, as shown in FIG. 1A to FIG. 13.

Figure 17:
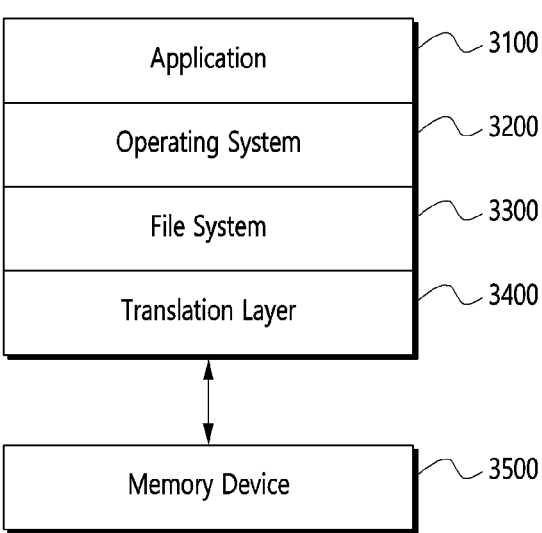
FIG. 17 is a block diagram illustrating a computing system in accordance with various embodiments.

FIG. 17 is a block diagram illustrating a computing system in accordance with examples of embodiments.

As illustrated in FIG. 17, a computing system 3000 may include a software layer that has an operating system 3200 an application 3100, a file system 3300, and a translation layer 3400. In addition, the computing system 3000 may include a hardware layer such as a memory device 3500.

The operating system 3200 manages software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

The translation layer 3400 may translate an address to be suitable for the memory device 3500 in response to a request from the file system 3300. For example, the translation layer 3400 may translate a logic address, generated by the file system 3300, into a physical address of the memory device 3500, Mapping information of the logic address and the physical address may be stored in an address translation table. For example, the translation layer 3400 may be a flash translation layer (FTL), a universal flash storage link layer (ULL) or the like.

The memory device 3500, in an embodiment, may improve an integration density of stacked word lines by the preliminary conductive pattern surrounding the insulation pattern, as shown in FIG. 1A to FIG. 13.

The computing system 3000 with the above-described configuration may be divided into an operating system layer that is operated in an upper layer region and a controller layer that is operated in a lower level region. The operating system 3200, the application 3100, and the file system 3300 may be included in the operating system layer and driven by an operation memory. In addition, the translation layer 3400 may be included in the operating system layer or the controller layer.

As described above, in an embodiment, a property of the computing system 3000 can be improved using the stack structure in which the integrated density of the word lines of the memory device 3500 is improved, as shown in FIG. 1A to FIG. 13.

The above-described embodiments are intended to illustrate and not to limit the embodiments. Various alternatives and equivalents are possible. Possible embodiments are not limited by the specific embodiments described herein. Nor are the embodiments limited to any specific type of semiconductor device, Other additions, subtractions, or modifications are possible in view of the present disclosure and are intended to fall within the scope of the appended claims.

What is claimed is:

1. A three-dimensional (3D) semiconductor device comprising:
   a stack structure including a first insulation pattern, a conductive pattern arranged over the first insulation pattern, and a second insulation pattern configured to physically contact an upper surface of the conductive pattern, the second insulation pattern having a property different from a property of the first insulation pattern; and
   at least one vertical channel structure arranged in the stack structure,
   wherein the conductive pattern has a thickness thinner than a thickness of the first insulation pattern and thinner than a thickness of the second insulation pattern.

2. The 3D semiconductor device of claim 1, wherein at least one of the first and second insulation patterns comprises an oxide material including silicon oxide and metal oxide, a nitride material including silicon nitride and silicon oxynitride, and an insulation material including impurities and an air gap.

3. The 3D semiconductor device of claim 1, wherein the first and second insulation patterns include a same kind of an insulation material, and
   wherein a stoichiometry of the first insulation pattern is different from a stoichiometry of the second insulation pattern.

4. The 3D semiconductor device of claim 1, wherein the first and second insulation patterns have a same thickness.

5. The 3D semiconductor device of claim 1 wherein the first and second insulation patterns comprise different kinds of insulation materials, and
   a dielectric constant range of the first insulation pattern overlaps a dielectric constant range of the second insulation pattern.

6. The 3D semiconductor device of claim 1, wherein the conductive pattern comprises at least one conductive material layer.

7. The 3D semiconductor device of claim 6, wherein the conductive material layer comprises molybdenum.

8. The 3D semiconductor device of claim 1, wherein the conductive pattern comprises a barrier layer and a conductive layer, the barrier layer contacts a surface of the first insulation pattern, and the conductive layer contacts a surface of the second insulation pattern.

9. A 3D semiconductor device comprising:
   a stack structure including a first insulating interlayer, a lower word line, a second insulating interlayer, and an upper word line sequentially stacked in a cell region and a contact region; and at least one vertical channel structure including a data storage layer formed through the stack structure in the cell region,
   wherein a property of the first insulating interlayer is different from a property of the second insulating interlayer, and
   wherein a thickness of the second insulating interlayer in the contact region is thicker than a thickness of the second insulating interlayer in the cell region.

10. The 3D semiconductor device of claim 9, wherein at least one of the first and second insulating interlayers includes an oxide material including silicon oxide and metal oxide, a nitride material including silicon nitride and silicon oxynitride, and an insulation material including impurities and an air gap.

11. The 3D semiconductor device of claim 10, wherein the first and second insulating interlayers comprise a same kind of an insulation material, and
   wherein a stoichiometry of the first insulating interlayer is different from a stoichiometry of the second insulating interlayer.

12. The 3D semiconductor device of claim 9, wherein the first and second insulating interlayers comprise different kinds of insulation materials, and
   a dielectric constant range of the first insulating interlayer overlaps a dielectric constant range of the second insulating interlayer.

13. The 3D semiconductor device of claim 9, wherein at least one of a thickness of the upper word line and a thickness of the lower word line is thinner than a thickness of the first insulating interlayer and thinner than a thickness of the second insulating interlayer.

14. The 3D semiconductor device of claim 9, wherein the upper and lower word lines include a molybdenum layer, and
   the molybdenum layer has a first surface configured to contact the first insulating interlayer and a second surface configured to contact the second insulating interlayer.

15. The 3D semiconductor device of claim 9, wherein the upper and lower word lines include a barrier layer and a conductive layer formed on the barrier layer, and
   wherein the barrier layer contacts the first insulating interlayer and the conductive layer contacts the second insulating interlayer.

16. The 3D semiconductor device of claim 9, wherein the lower word line is disposed along a lower surface of the second insulating interlayer, a side surface of the second insulating interlayer, and an end portion of an upper surface of the second insulating interlayer, and the upper word line is disposed on the upper surface of the second insulating interlayer, and
   wherein the upper word line and the lower word line are electrically separated from each other by a cut portion at the upper surface of the second insulating interlayer.

17. The 3D semiconductor device of claim 9, further comprising:
   a first contact plug arranged in the contact region and contacting the upper word line; and
   a second contact plug arranged in the contact region and contacting the lower word line,
   wherein the first contact plug and the second contact plug have a same height.

18. The 3D semiconductor device of claim 9, wherein the vertical channel structure further comprises at least one protruded portion arranged at an outer surface of the vertical channel structure corresponding to the second insulating interlayer.

19. A 3D semiconductor device comprising:
an insulating pattern comprising a lower surface, an upper surface and a side surface connecting the lower surface and the upper surface;
an upper word line disposed on the upper surface of the insulating pattern; and
a lower word line disposed along the lower surface, the side surface and an end portion of the upper surface of the insulating pattern,
wherein the upper word line is electrically separated from the lower word line.

20. The 3D semiconductor device of claim 19, further comprising:
a first contact plug disposed over the insulating pattern and configured to contact the upper word line; and
a second contact plug disposed over the insulating pattern and configured to contact the lower word line at the end portion.

*  *  *  *  *